(12) United States Patent
Tsuchiya et al.

(10) Patent No.: US 10,998,609 B2
(45) Date of Patent: May 4, 2021

(54) LOOP ANTENNA

(71) Applicant: Japan Aviation Electronics Industry, Limited, Tokyo (JP)

(72) Inventors: Kenta Tsuchiya, Tokyo (JP); Osamu Hirata, Tokyo (JP); Daisuke Hiraoka, Tokyo (JP); Mitsunori Sato, Tokyo (JP); Yutaka Takezawa, Tokyo (JP); Yutaro Kogawa, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 16/613,633

(22) PCT Filed: Jan. 23, 2018

(86) PCT No.: PCT/JP2018/001893
§ 371 (c)(1),
(2) Date: Nov. 14, 2019

(87) PCT Pub. No.: WO2018/220893
PCT Pub. Date: Dec. 6, 2018

(65) Prior Publication Data
US 2020/0203830 A1 Jun. 25, 2020

(30) Foreign Application Priority Data
May 31, 2017 (JP) .............................. JP2017-108033

(51) Int. Cl.
*H01Q 7/00* (2006.01)
*H01Q 1/12* (2006.01)
(Continued)

(52) U.S. Cl.
CPC ............. *H01Q 1/1271* (2013.01); *H01Q 7/00* (2013.01); *H01Q 21/30* (2013.01); *H01Q 1/38* (2013.01)

(58) Field of Classification Search
CPC .............................. H01Q 1/1271; H01Q 7/00
(Continued)

(56) References Cited

U.S. PATENT DOCUMENTS 10,391,871 B2 * 8/2019 Lu .......................... B60L 11/182
2008/0158092 A1 * 7/2008 Yakubo ................ H01Q 1/2283
343/866

(Continued)

FOREIGN PATENT DOCUMENTS

CN    101180764 A    5/2008
CN    101180765 A    5/2008
(Continued)

OTHER PUBLICATIONS

Ohinese Office Action in CN 201880033224.9, dated Jul. 28, 2020.
(Continued)

*Primary Examiner* — Peguy Jean Pierre
(74) *Attorney, Agent, or Firm* — Collard & Roe, P.C.

(57) ABSTRACT

This loop antenna is provided with: an insulating substrate; an antenna portion that is a conductor provided on the substrate and includes a first feeding portion, a second feeding portion, and an antenna mesh portion having a mesh structure and forming a loop shape by connecting the two feeding portions to each other; and a dummy pattern part portion that is a conductor having a mesh structure and provided in a region surrounded by the antenna portion, and is isolated from the antenna portion. The dummy pattern portion has at least one cut portion that cuts a path included in the mesh structure.

7 Claims, 18 Drawing Sheets

(51) Int. Cl.
*H01Q 21/30* (2006.01)
*H01Q 1/38* (2006.01)

(58) Field of Classification Search
USPC .................................................. 343/700.003
See application file for complete search history.

(56) References Cited

U.S. PATENT DOCUMENTS

| | | |
|---|---|---|
| 2009/0051620 A1 | 2/2009 | Ishibashi et al. |
| 2009/0140938 A1 | 6/2009 | Ishibashi et al. |
| 2013/0249663 A1 | 9/2013 | Cho |
| 2015/0255856 A1 | 9/2015 | Hong et al. |
| 2017/0344766 A1 | 11/2017 | Yashiro et al. |

FOREIGN PATENT DOCUMENTS

| | | |
|---|---|---|
| CN | 106104915 A | 11/2016 |
| EP | 0 911 906 A2 | 4/1999 |
| JP | S64-49302 A | 2/1989 |
| JP | 2000-138512 A | 5/2000 |
| JP | 2005142984 A | 6/2005 |
| JP | 2007-156874 A | 6/2007 |
| JP | 2008-092425 A | 4/2008 |
| JP | 2013-198165 A | 9/2013 |
| TW | 200642164 A | 12/2006 |
| WO | 2016/084667 A1 | 6/2016 |

OTHER PUBLICATIONS

Taiwan Office Action in TW 10820438170, dated May 9, 2019.
International Search Report in PCT/JP2018/001893, dated Apr. 3, 2018.

* cited by examiner (a)

(b)

(c)

(d)

(a)

(b)

(a)

(b)

LOOP ANTENNA

CROSS REFERENCE TO RELATED APPLICATIONS

This application is the National Stage of PCT/JP2018/001893 filed on Jan. 23, 2018, which claims priority under 35 U.S.C. § 119 of Japanese Application No. 2017-10833 filed on May 31, 2017, the disclosure of which is incorporated by reference. The international application under PCT article 21(2) was not published in English.

TECHNICAL FIELD

This invention relates to a loop antenna.

BACKGROUND ART

A loop antenna is an antenna including two power feeding portions and a loop-shaped conductor that connects the two power feeding portions to each other. The loop antenna may adopt a mesh structure for the loop-shaped conductor to form the conductor into a thin film shape, so that the conductor becomes inconspicuous.

A film-shaped loop antenna is sometimes placed on a front windshield of an automobile, or in a similar place. This is because it is desired from design and decorative appearance that the loop antenna be inconspicuous and not be visually recognized as an antenna in such cases.

In Patent Document 1, there is proposed a film antenna in which a conductive pattern 3A made from a mesh-shaped conductor and forming an antenna circuit is located on a surface of a resin film, and a pattern 3B having a color and a shape that are visually similar to those of the mesh-shaped conductor is formed in an area outside the conductive pattern 3A (see FIG. 25). Patent Document 1 describes that the pattern 3B formed in the area outside the conductive pattern 3A is electrically separated from the conductive pattern 3A, which forms the antenna circuit, as illustrated in FIG. 25.

According to Patent Document 1, it becomes hard to recognize the conductive pattern 3A by forming the conductive pattern 3A, which forms the antenna circuit, and the pattern in a margin of the antenna circuit into a mesh shape, with the result that cosmetic appeal is improved.

PRIOR ART DOCUMENTS

Patent Document

Patent Document 1: JP S64-49302 A

SUMMARY OF THE INVENTION

Problem to be Solved by the Invention

The invention described in Patent Document 1 may be applied to render the loop antenna described above, which adopts a mesh structure for the loop-shaped conductor, hard to be visually recognized as an antenna. In this case, when the loop-shaped conductor functioning as an antenna is referred to as "antenna portion", the pattern having a color and a shape that are visually similar to those of the loop-shaped conductor (hereinafter referred to as "dummy pattern portion") is placed in an area surrounded by the antenna portion.

The inventors of this invention examined antenna characteristics of a loop antenna including this type of antenna portion and dummy pattern portion by electromagnetic field simulation.

To describe in detail, an antenna portion 11 of a loop antenna 10, which is the examined loop antenna, includes two power feeding portions 12 and an antenna mesh portion 13, which is shaped into a loop to connect the two power feeding portions 12 to each other and which has a mesh structure, as illustrated in FIG. 26. The antenna mesh portion 13 is a conductor having a belt-shaped mesh structure that is 10 mm in width, and is shaped into a rectangular loop. The antenna portion 11 is separated from a dummy pattern portion 14 in the examined loop antenna 10. The antenna mesh portion 13 and the dummy pattern portion 14 adopt the same mesh structure in which longitudinal and lateral strings of squares are arranged.

A frequency of 600 MHz was employed for a transmitted or received electromagnetic wave in the electromagnetic field simulation. A line interval L of the mesh structure of the dummy pattern portion 14 was set to 3.2 mm or 6.4 mm. A line width W of the mesh structure of the dummy pattern portion 14 was set to 10 μm or 20 μm.

FIG. 27 is a graph for showing a relationship between antenna radiation efficiency (the vertical axis) as the performance of the loop antenna 10 and a separation distance D (the horizontal axis) between the antenna portion 11 and the dummy pattern portion 14, which was obtained as a result of the electromagnetic field simulation. Even when simulations were performed with the line width W set to different widths, that is, 10 μm and 20 μm, substantially the same result was obtained. Therefore, in FIG. 27, a graph that indicates the result obtained when the line width W was 10 μm and a graph that indicates the result obtained when the line width W was 20 μm overlap in most parts for each of the loop antenna 10 that is 3.2 mm in line interval L and the loop antenna 10 that is 6.4 mm in line interval L. FIG. 27 consequently looks as though there are two graphs. In FIG. 27, the graphs that indicate results obtained when the line interval L was 3.2 mm are represented by solid lines, and the graphs that indicate results obtained when the line interval L was 6.4 mm are represented by dotted lines.

As a result of the electromagnetic field simulation, it was found that, as shown in FIG. 27, a close distance between the antenna portion 11 and the dummy pattern portion 14 caused the performance of the loop antenna 10 to drop, even to a degree that the loop antenna 10 no longer functioned as an antenna. It was also found that, in order for the loop antenna 10 to fully function as an antenna, the separation distance D between the antenna portion 11 and the dummy pattern portion 14 was required to be approximately 6 mm or more irrespective of what combination of an interval and a width was used for the line interval L and the line width W.

When the antenna portion 11 and the dummy pattern portion 14 are at a distance of a few millimeters from each other, however, the border between the antenna portion 11 and the dummy pattern portion 14 is visually recognizable, which makes it difficult to achieve the goal of rendering the loop antenna hard to be visually recognized as an antenna.

This invention has been made in view of those circumstances, and an object of this invention is therefore to provide a loop antenna that is hard to be visually recognized as an antenna, while reducing a performance degradation as an antenna.

In order to achieve the above-mentioned object, a loop antenna according to this invention comprises:

an insulating substrate including one surface that spreads in surface shape;

an antenna portion, which is a conductor formed on the one surface of the substrate to receive or transmit a radio wave, and which includes a first power feeding portion, a second power feeding portion, and an antenna mesh portion having a mesh structure, the antenna mesh portion being shaped into a loop to connect the two power feeding portions to each other; and a dummy pattern portion, which is a conductor having a mesh structure and formed in an area of the one surface of the substrate that is surrounded by the antenna portion, and which is separated from the antenna portion, wherein the dummy pattern portion includes:
a first close end portion closest to the first power feeding portion;
a second close end portion closest to the second power feeding portion; and
a cut portion formed to cut a path that is included in the mesh structure, so that a flow of current that affects operation of the antenna portion is prevented from flowing, and wherein the cut portion is formed in a minimum loop path geometrically defined as a path that connects the first close end portion and the second close end portion over the shortest distance out of paths formed by the conductor having the mesh structure.

The cut portion may be one of a plurality of cut portions formed, the dummy pattern portion may include
a first dummy loop portion, out of loops formed by the conductor of the dummy pattern portion, which is a conductor that forms the largest loop along the antenna portion;
a second dummy loop portion, out of the loops formed by the conductor of the dummy pattern portion, which is a conductor that forms the largest loop along the first dummy loop portion in an area surrounded by the first dummy loop portion; and
a plurality of intersecting lines, which are located between the antenna portion and the second dummy loop portion, and intersect the first dummy loop portion, and
at least one of the plurality of cut portions may be formed in each section of the first dummy loop portion that is located between two adjacent intersecting lines out of the plurality of intersecting lines, and in each of the plurality of intersecting lines.

The cut portion may comprise a plurality of cut portions formed, the mesh structure of the dummy pattern portion may be a structure in which a plurality of unit shapes are connected in a two-dimensionally continuous manner, and at least one of the plurality of cut portions may be formed in every one of the plurality of unit shapes.

The antenna portion and the dummy pattern portion may have the same mesh structure.

The mesh structure may have squares or circles as the plurality of unit shapes.

The first power feeding portion and the second power feeding portion may be each a conductor having a mesh structure that has higher density than that of the mesh structure of the antenna mesh portion, or a conductor spreading in surface shape without a break.

The substrate may comprise a resin film.

Effect of the Invention

According to this invention, the loop antenna is rendered hard to be visually recognized as an antenna, while reducing a performance degradation as an antenna.

MODES FOR CARRYING OUT THE INVENTION

Figure 1:
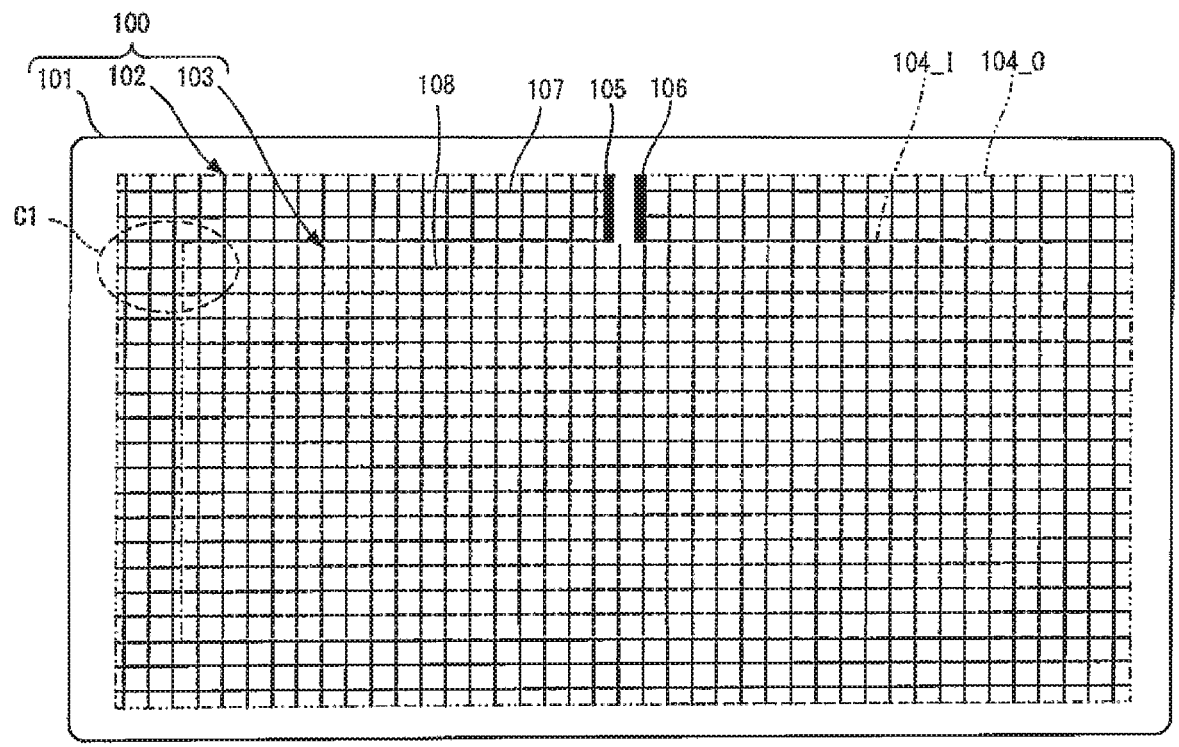
FIG. 1 is a view for illustrating a configuration of a loop antenna according to a first embodiment of this invention.

Loop antennas according to embodiments of this invention are described below with reference to the drawings. Throughout the drawings, the same component is denoted by the same reference symbol. In the description of the embodiments of this invention and the drawings, terms "upper", "lower", "front", "back", "right", and "left" are used to describe directions, not to limit this invention. The proportion of the sizes of portions in the drawings may be changed when required for easy understanding.

First Embodiment

A loop antenna 100 according to a first embodiment of this invention includes a substrate 101, an antenna portion 102, and a dummy pattern portion 103.

The substrate 101 is an insulating transparent member including one surface that spreads in surface shape. The substrate 101 of the first embodiment is a resin film. The substrate 101 may be a glass sheet, and the one surface spreads in surface shape may be curved.

The antenna portion 102 is a conductor formed on the one surface of the substrate 101 in order to receive or transmit a radio wave. The antenna portion 102 in FIG. 1 is formed in an area sandwiched between two rectangles that are indicated by two-dot chain lines 104_I and 104_O. The two-dot chain lines 104_I and 104_O are virtual lines for describing the area in which the antenna portion 102 is formed.

The antenna portion 102 includes a first power feeding portion 105, a second power feeding portion 106, and an antenna mesh portion 107, which is shaped into a loop to connect the first power feeding portion 105 and the second power feeding portion 106 to each other and which has a mesh structure.

The first power feeding portion 105 and the second power feeding portion 106 are each a contact point portion to which various electric circuits, for example, an oscillation circuit and an amplification circuit, are connected. The first power feeding portion 105 and the second power feeding portion 106 are each preferred to be a conductor having a mesh structure that has higher density than that of the mesh structure of the antenna mesh portion 107, or a conductor spreading in surface shape without a break, in order to reduce contact resistance. In the first embodiment, as illustrated in FIG. 1, each feeding unit spreads without a break in a rectangular pattern.

Figure 2:
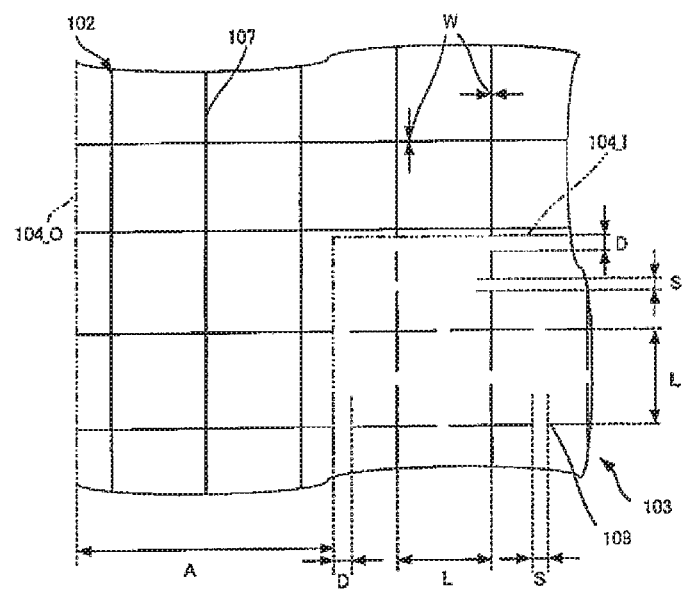
FIG. 2 is an enlarged view of a portion of FIG. 1 that is encircled by a dotted-line circle C1, and the portion's vicinity.

The antenna mesh portion 107 of the first embodiment has a belt-shaped mesh structure that has a constant width A (see FIG. 2) and that extends along the outer edge 104_O of the rectangle. As a result, the antenna mesh portion 107 is shaped into a rectangular loop. FIG. 2 is an enlarged view of a portion of FIG. 1 that is encircled by a dotted-line circle C1, and the portion's vicinity. The width A may be set to a suitable width, for example, 10 mm.

The antenna mesh portion 107 has a geometric mesh structure that connects a plurality of unit shapes in a two-dimensionally continuous manner. The mesh structure of the first embodiment uses a square as a unit shape, and is a structure in which squares are aligned to be flush with one another longitudinally and laterally. A unit-shape size (the length of one side and corresponds to the "line interval" described above) L (see FIG. 2) may be set to a suitable size, for example, 2 mm to 10 mm.

In other words, the antenna mesh portion 107 of the first embodiment is copper wires, silver wires, or other conductive wires that are aligned longitudinally and laterally at the interval L, to thereby form a mesh structure that uses a square having the size L as a unit shape. The thickness W (see FIG. 2) of each conductive wire may be set to a suitable thickness, for example, 10 μm to 20 μm.

The dummy pattern portion 103 is a conductor having a mesh structure and formed in an area of the one surface of the substrate 101 that is surrounded by the antenna portion 102. The area surrounded by the antenna portion 102 in the first embodiment corresponds to an area surrounded by the two-dot chain line 104_I in FIG. 1. In the first embodiment, the mesh structure of the dummy pattern portion 103 is the same as the mesh structure of the antenna mesh portion 107. The fact that the mesh structures are the same means that the unit shape forming one mesh structure, the size L of the unit shape, and the thickness W of each conductive wire of the one mesh structure are the same as those of another mesh structure.

The dummy pattern portion 103 and antenna mesh portion 107 may have mesh structures different from each other.

As illustrated in FIG. 1 and FIG. 2, the dummy pattern portion 103 is separated from the antenna portion 102. A separation distance D (see FIG. 2) between the dummy pattern portion 103 and the antenna portion 102 may be set to a suitable distance as long as the separating portion is rendered hard to be visually recognized, for example, 10 μm.

As illustrated in FIG. 1 and FIG. 2, the dummy pattern portion 103 includes a plurality of cut portions 108, which cut paths included in the mesh structure. The cut portions 108 each cut a path to stop a flow of current that affects the operation of the antenna portion 102.

In other words, the cut portions 108 in the first embodiment are each a site at which one of the conductive wires forming the mesh structure is cut. A distance (cut distance) S (see FIG. 2) over which the conductive wire is cut may be any distance at which a flow of current that affects the operation of the antenna portion 102 is stopped, for example, 200 μm to 500 μm.

The cut portions 108 of the first embodiment are formed in every square that is a unit shape on the four sides of the square, and are an example of forming at least one cut portion 108 in a plurality of unit shapes. In other words, the cut portions 108 of the first embodiment are formed at substantially the interval L in the conductive wires extending longitudinally and laterally, and accordingly, each cut portion 108 is placed in substantially the middle of each side of each square that is a unit shape.

In the above, the loop antenna 100 according to the first embodiment of this invention is described.

As already described, the dummy pattern portion 103 is separated from the antenna portion 102 and includes the plurality of cut portions 108 described above. The loop antenna 100 can thus be rendered hard to be visually recognized as an antenna while reducing a performance degradation as an antenna even when the dummy pattern portion 103 is formed in an area inside the antenna portion 102.

The first embodiment may be modified as follows.

For instance, the substrate 101, which is transparent in the example described in the first embodiment, may be colored and may be semi-transparent or non-transparent, to suit individual cases. The same effect as the one in the first embodiment is obtained in this case as well.

For instance, the dummy pattern portion 103 may be processed so that a letter, a design, or the like is shown in white.

Modification Example 1

Figure 3:
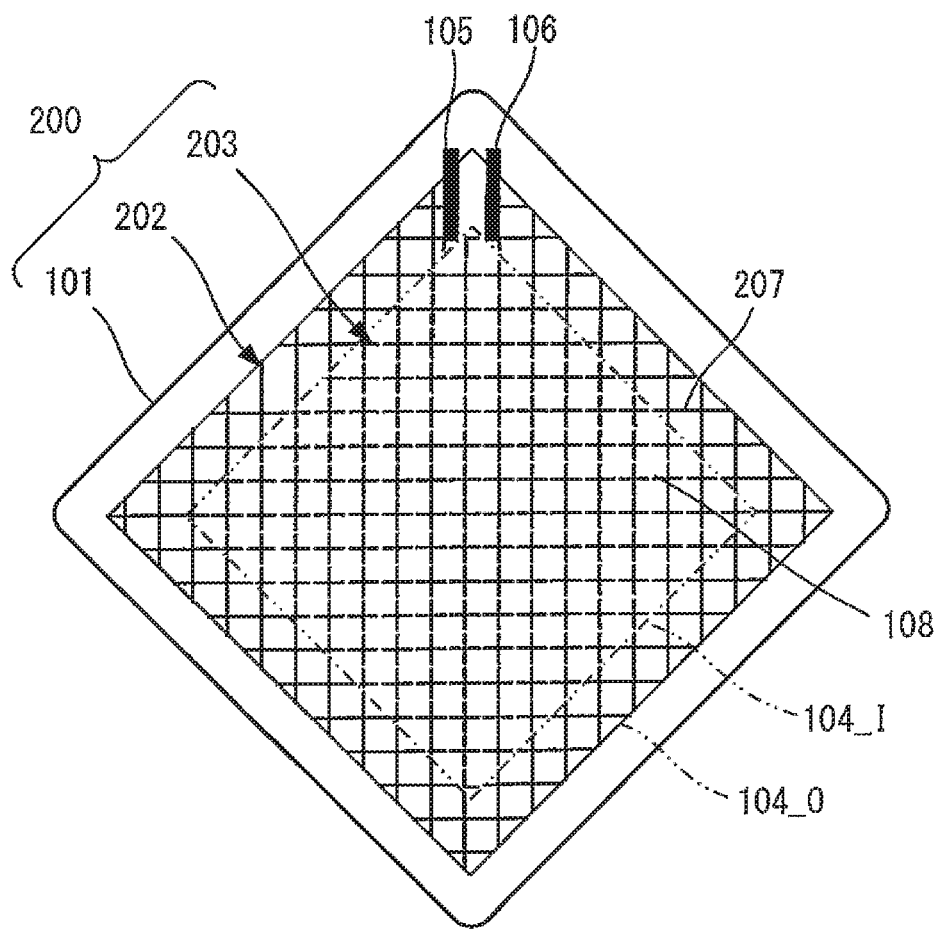
FIG. 3 is a view for illustrating a configuration of a loop antenna of Modification Example 1.

The antenna mesh portion 107 in the example described in the first embodiment is a rectangular loop. However, the loop shape into which the antenna mesh portion 107 is shaped is not limited thereto, and may be a rhombus, another polygon, a circle, or other shapes. An example in which the loop shape of the antenna mesh portion 107 is a rhombus is illustrated in FIG. 3. An antenna portion 202 of a loop antenna 200 illustrated in FIG. 3 includes an antenna mesh portion 207 shaped into a rhombus loop. A dummy pattern portion 203 is formed so as to have a rhombus outline in an area inside the antenna mesh portion 207. The loop antenna 200 is preferred to be configured in the same way as the loop antenna 100 according to the first embodiment, except for those points.

Modification Example 2

The unit shape of the mesh structure is a square in the example described in the first embodiment. However, the unit shape of the mesh structure may be, for example, a polygon other than a square, a circle, or a part of the polygon or the circle (a polygonal line, a curve, or the like). The method of arranging unit shapes of the mesh structure in a two-dimensionally continuous manner is not limited to that of the first embodiment, in which the unit shapes are flush with one another longitudinally and laterally. The unit shapes may be arranged so as to be staggered from one another longitudinally and laterally, or sets of unit shapes arranged in a two-dimensionally continuous manner may be overlapped with each other.

Figure 4:
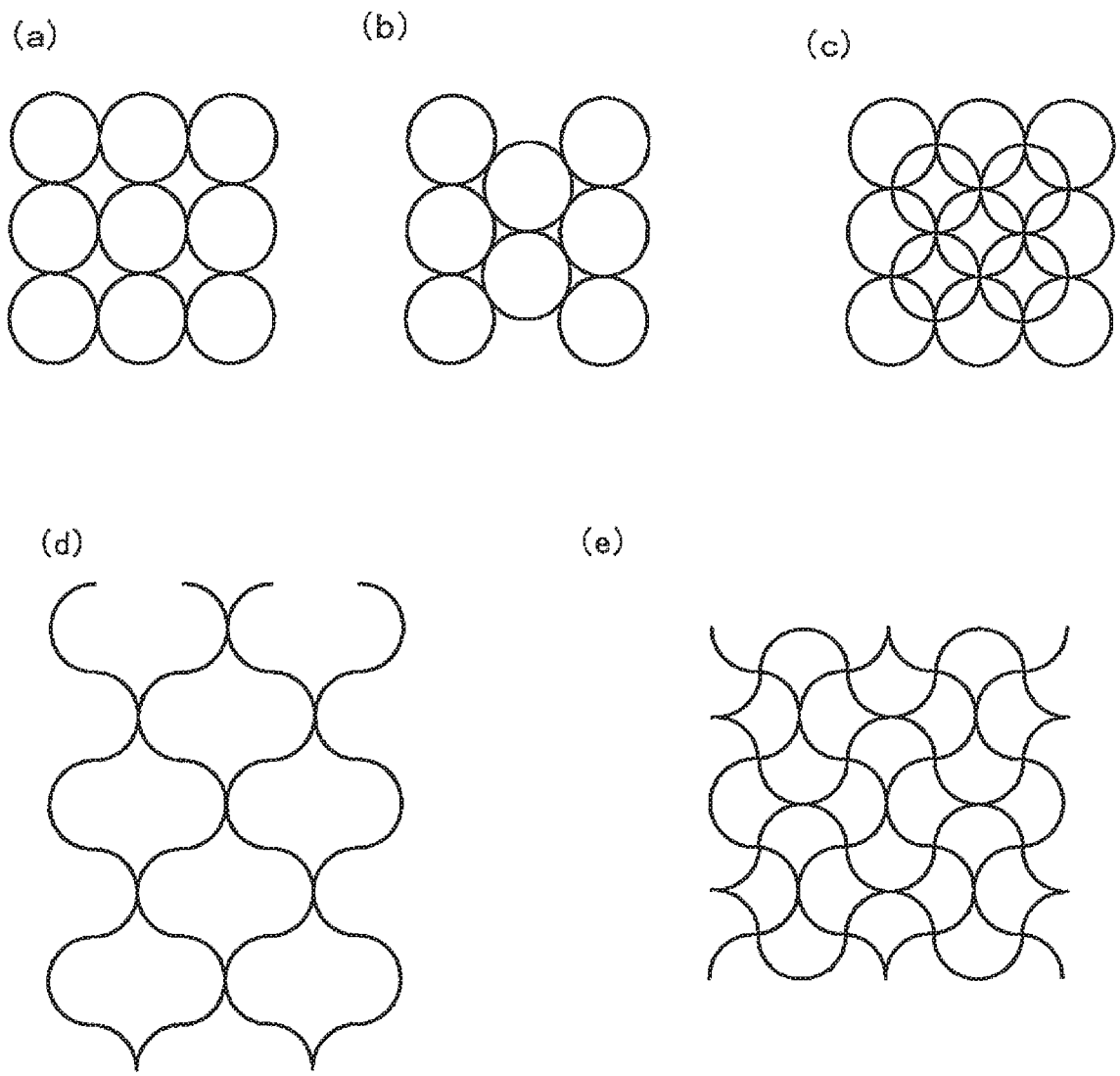
FIG. 4 includes views for illustrating modification examples of a mesh structure.

FIG. 4(a) to FIG. 4(c) are examples of using a circle as a unit shape, and FIG. 4(d) and FIG. 4(e) are examples of using a semi-circle as a unit shape.

FIG. 4(a) is a view for illustrating an example of a mesh structure in which circles that are unit shapes are arranged to be flush with one another longitudinally and laterally. FIG. 4(b) is a view for illustrating an example of a mesh structure in which circles that are unit shapes are arranged to be staggered from one another by half a unit shape longitudinally and laterally. FIG. 4(c) is a view for illustrating an example of a mesh structure in which two sets of circles arranged to be flush with one another longitudinally and laterally are staggered from each other by half a unit shape longitudinally and laterally.

FIG. 4(d) is a view for illustrating an example of a mesh structure in which lines of longitudinally connected semi-circles are arranged side by side so that semi-circles in one line are in contact with semi-circles in another line. FIG. 4(e) is a view for illustrating an example of a mesh structure in which the semi-circles illustrated in FIG. 4(d), namely, lines of longitudinally connected semi-circles that are arranged side by side, are overlapped with lines of laterally connected semi-circles that are arranged from top to bottom.

The same effect as the one in the first embodiment is obtained in Modification Examples 1 and 2 as well.

Second Embodiment

The cut portions 108 in the example described in the first embodiment are formed in every square that is included in the dummy pattern portion 103 on the four sides of the square. In a second embodiment of this invention, a description is given on an example of forming the cut portions 108 in a plurality of squares (as unit shapes) that form the largest loop shape out of loop shapes substantially similar to the antenna mesh portion 107.

Figure 5:
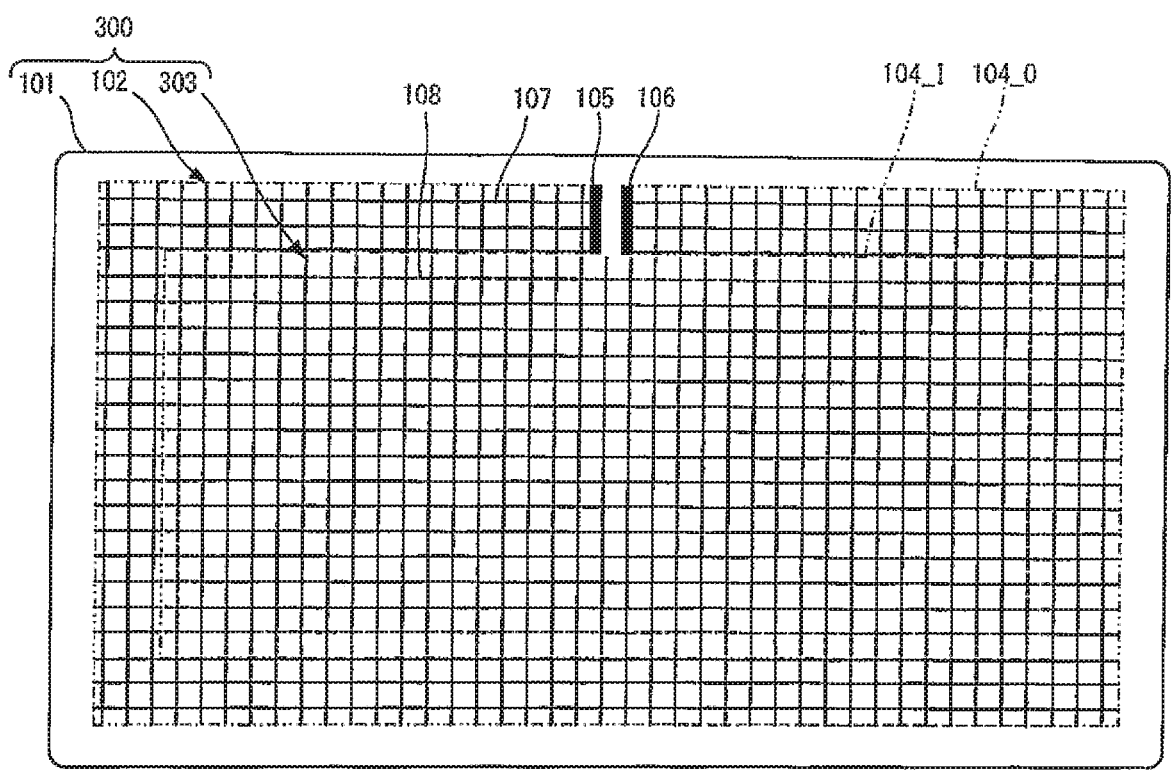
FIG. 5 is a view for illustrating a configuration of a loop antenna according to a second embodiment of this invention.

As illustrated in FIG. 5, a loop antenna 300 according to the second embodiment includes the substrate 101 and the antenna portion 102, which are the same as those in the first embodiment, and a dummy pattern portion 303, which is different from the one in the first embodiment.

The dummy pattern portion 303 is the same conductor having a mesh structure as the one in the first embodiment, and is provided with a plurality of cut portions 108 as in the first embodiment. The difference between the dummy pattern portion 303 of the second embodiment and the dummy pattern portion 103 of the first embodiment resides in where the cut portions 108 are formed.

In the second embodiment, the plurality of cut portions 108 are formed in a first dummy loop portion 309 and a plurality of first intersecting lines 310 out of the conductor forming the dummy pattern portion 303, so as to circuit along the loop shape once. To describe in detail, the plurality of cut portions 108 are formed so that one cut portion 108 is formed in each section of the first dummy loop portion 309 that is located between two adjacent first intersecting lines 310, and in each of the plurality of first intersecting lines 310, out of the dummy pattern portion 303.

To give a more detailed description on the cut portions 108 that are formed in the first intersecting lines 310, in the first intersecting lines 310 that extend from the first dummy loop portion 309 to the outside by a length greater than a half of the size L of the unit shape, the cut portions 108 are formed outside the first dummy loop portion 309. In the first intersecting lines 310 that extend from the first dummy loop portion 309 to the outside by a length equal to or less than a half of the size L of the unit shape, the cut portions 108 are formed inside the first dummy loop portion 309.

Figure 6:
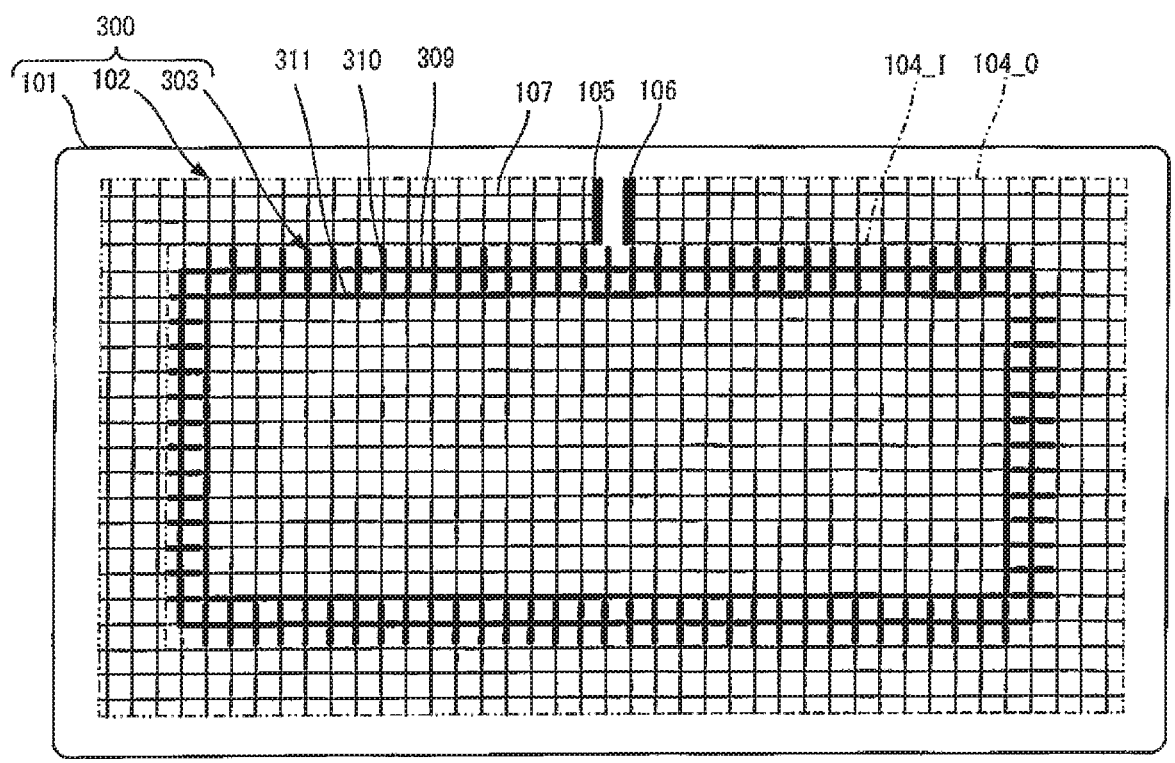
FIG. 6 is a view for illustrating a first dummy loop portion, second dummy loop portion, and first intersecting line of a dummy pattern portion.

As illustrated in FIG. 6, the first dummy loop portion 309 is a conductor that forms the largest loop along the antenna portion 102 out of loops (rectangular in the second embodiment) formed by the conductor of the dummy pattern portion 303.

As illustrated in FIG. 6, a second dummy loop portion 311 is a conductor that forms the largest loop along the first dummy loop portion 309 in an area surrounded by the first dummy loop portion 309, out of the loops formed by the conductor of the dummy pattern portion 303.

As illustrated in FIG. 6, the plurality of first intersecting lines 310 are conductors that are located between the antenna portion 102 and the second dummy loop portion 311, and that intersect the first dummy loop portion 309.

In the above, the loop antenna 300 according to the second embodiment of this invention is described.

As already described, the dummy pattern portion 303 is separated from the antenna portion 102 and includes the plurality of cut portions 108 described above. The loop antenna 300 can thus be rendered hard to be visually recognized as an antenna while reducing a performance degradation as an antenna, even when the dummy pattern portion 303 is formed in an area inside the antenna portion 102.

The second embodiment may be modified as follows.

Modification Example 3

Figure 7:
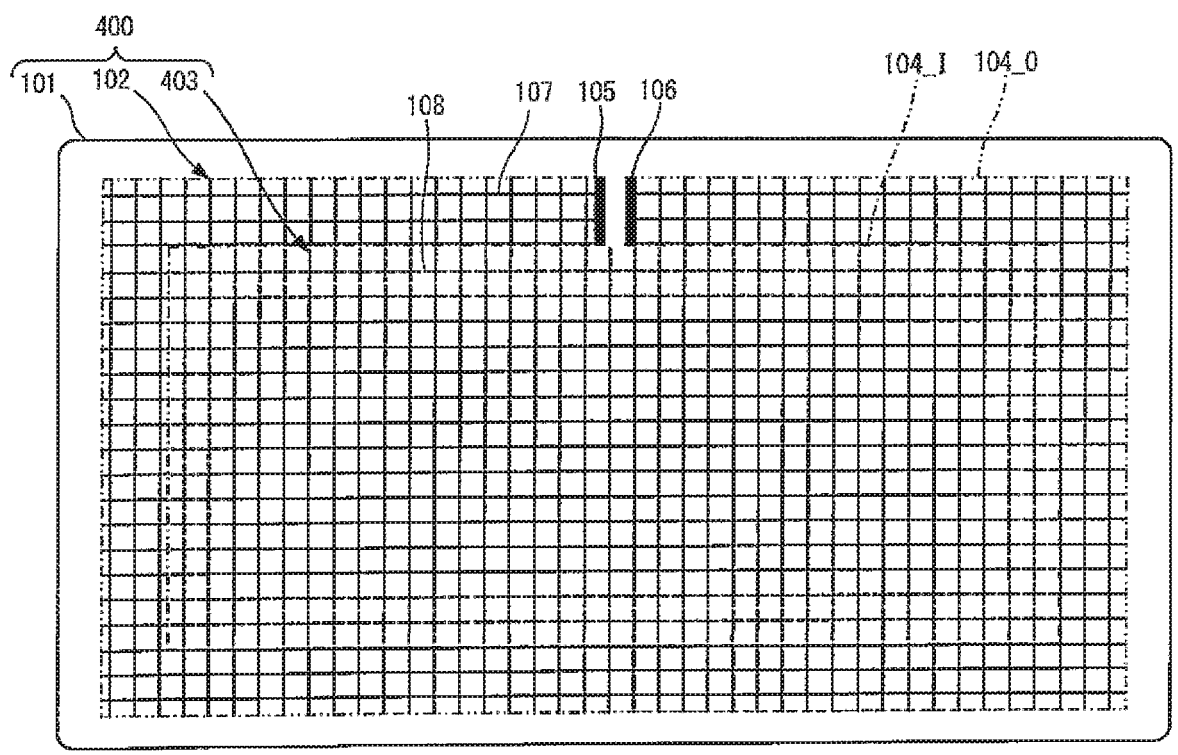
FIG. 7 is a view for illustrating a configuration of a loop antenna of Modification Example 3.

The plurality of cut portions 108 in the example described in the second embodiment are formed in the first dummy loop portion 309 and each of the plurality of first intersecting lines 310. In a loop antenna 400 of Modification Example 3, the plurality of cut portions 108 are formed so as to circuit along the loop shape once as in the second embodiment, and once more along the loop shape, that is, twice in total, as illustrated in FIG. 7. The plurality of cut portions 108 that are additionally formed in Modification Example 3 are formed in the second dummy loop portion 311 and each of a plurality of second intersecting lines 412, which intersect the second dummy loop portion 311, out of a dummy pattern portion 403, so as to circuit along the loop shape once. To describe in detail, the plurality of cut portions 108 that are additionally formed in Modification Example 3 are formed so that one cut portion 108 is formed in each section of the second dummy loop portion 311 that is located between two adjacent second intersecting lines 412, and in each of the plurality of second intersecting lines 412.

To give a more detailed description on the cut portions 108 that are formed in the second intersecting lines 412, in the second intersecting lines 412 that are connected (closest) to the first intersecting lines 310 that extend from the first dummy loop portion 309 to the outside by a length greater than a half of the size L of the unit shape, the cut portions 108 are formed outside the second dummy loop portion 311. In the second intersecting lines 412 that are connected (closest) to the first intersecting lines 310 that extend from the first dummy loop portion 309 to the outside by a length equal to or less than a half of the size L of the unit shape, the cut portions 108 are formed inside the second dummy loop portion 311.

Figure 8:
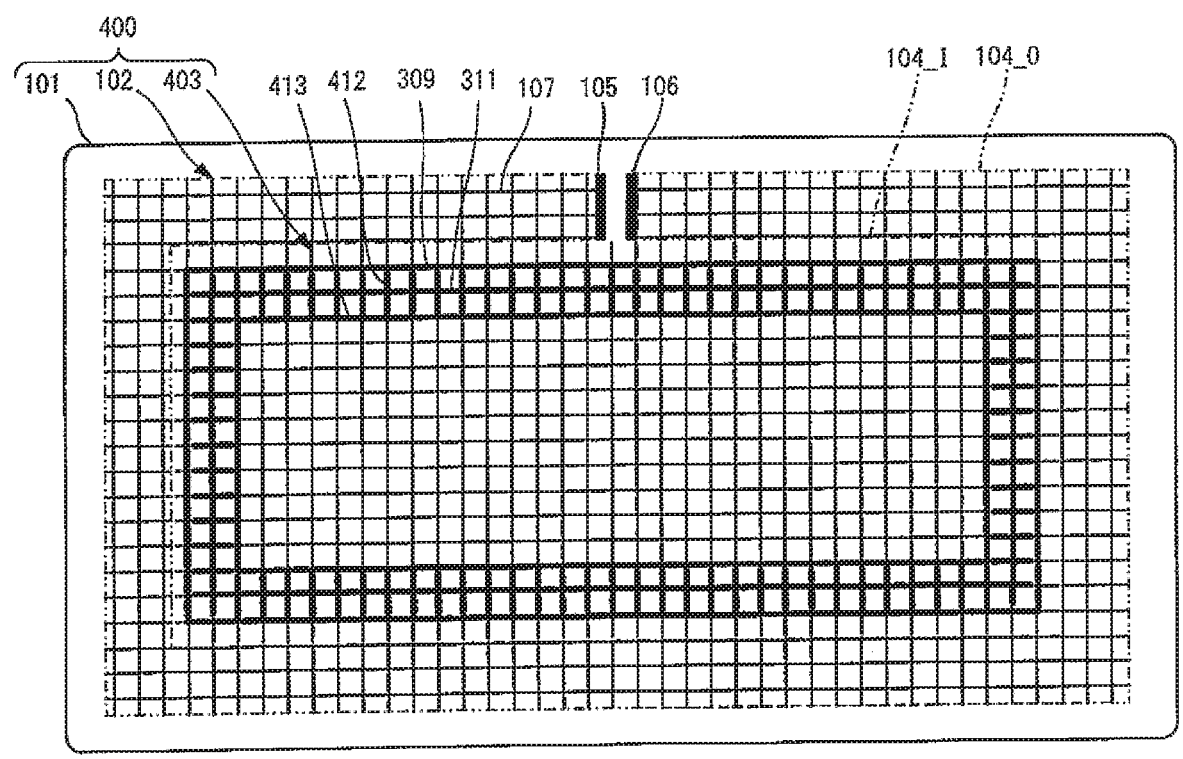
FIG. 8 is a view for illustrating a first dummy loop portion, second dummy loop portion, third dummy loop portion, and second intersecting line of a dummy pattern portion.

As illustrated in FIG. 8, the second dummy loop portion 311 is as described in the second embodiment.

As illustrated in FIG. 8, the plurality of second intersecting lines 412 are conductors that are located between the second dummy loop portion 311 and a third dummy loop portion 413, and that intersect the second dummy loop portion 311.

As illustrated in FIG. 8, the third dummy loop portion 413 is a conductor that forms the largest loop along the second dummy loop portion 311 in an area surrounded by the second dummy loop portion 311, out of the loops formed by the conductor of the dummy pattern portion 403.

The same effect as the one in the second embodiment is obtained in Modification Example 3 above as well.

Third Embodiment

The embodiments described above deal with examples of forming a plurality of cut portions 108. In a third embodiment of this invention, an example of forming one cut portion 108 is described.

Figure 9:
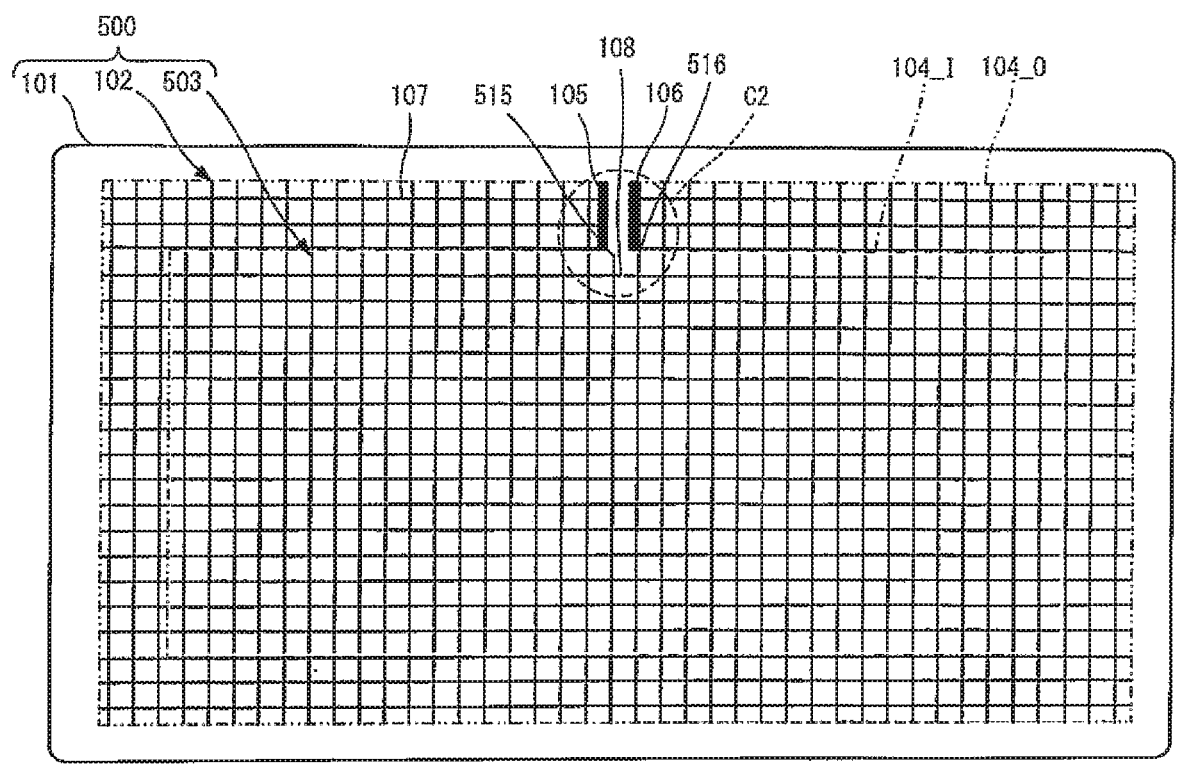
FIG. 9 is a view for illustrating a configuration of a loop antenna according to a third embodiment of this invention.

As illustrated in FIG. 9, a loop antenna 500 according to the third embodiment includes the substrate 101 and the antenna portion 102, which are the same as those in the first embodiment, and a dummy pattern portion 503, which is different from the one in the first embodiment.

The dummy pattern portion 503 is the same conductor having a mesh structure as the one in the first embodiment. In the third embodiment, one cut portion 108 is formed in a minimum loop path 514 unlike the other embodiments.

Figure 10:
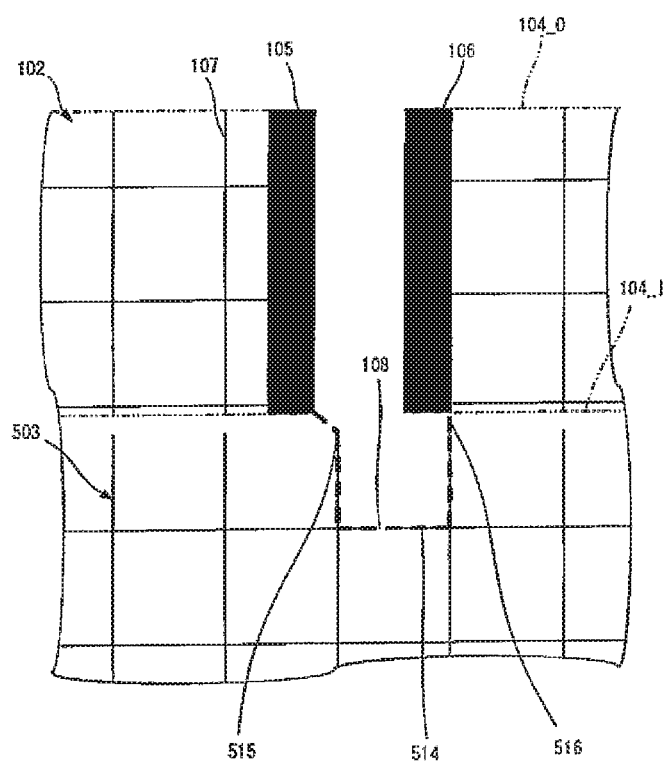
FIG. 10 is an enlarged view of a portion of FIG. 9 that is encircled by a dotted-line circle C2, and the portion's vicinity.

As illustrated in FIG. 10, the minimum loop path 514 is a path that connects a first close end portion 515 and a second close end portion 516 over the shortest distance out of paths formed by the conductor that has the mesh structure and that forms the dummy pattern portion 503. The minimum loop path 514 is defined geometrically regardless of the presence or absence of the cut portion 108.

The first close end portion 515 is an end portion closest to the first power feeding portion out of end portions of the dummy pattern portion 503. The second close end portion 516 is an end portion closest to the second power feeding portion out of the end portions of the dummy pattern portion 503.

In the above, the loop antenna 500 according to the third embodiment of this invention is described.

As already described, the dummy pattern portion 503 is separated from the antenna portion 102 and includes the cut portion 108 described above. The loop antenna 500 can thus be rendered hard to be visually recognized as an antenna while reducing a performance degradation as an antenna, even when the dummy pattern portion 503 is formed in an area inside the antenna portion 102.

The third embodiment may be modified as follows.

Modification Example 4

Positions at which the cut portion 108 may be placed when one cut portion 108 is formed as in the third embodiment are described in Modification Example 4.

Figure 11:
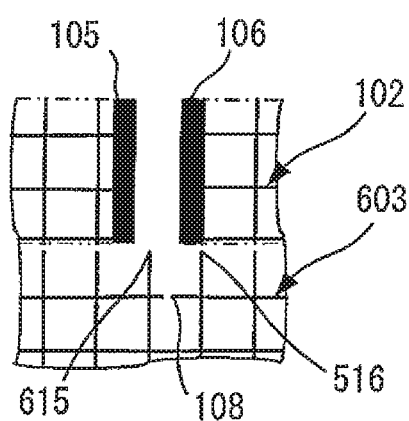
FIG. 11 includes enlarged views of portions corresponding to the portion of FIG. 9 that is encircled by the dotted-line circle C2 and the portion's vicinity, in which examples of a minimum loop path and a cut portion in a dummy pattern portion that is used in Modification Example 4 and that includes a plurality of first close end portions, are illustrated.
Figure 11:
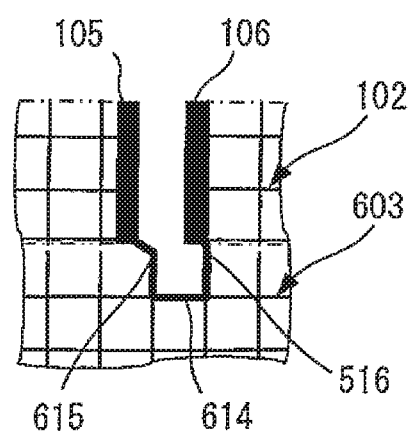
Figure 11:
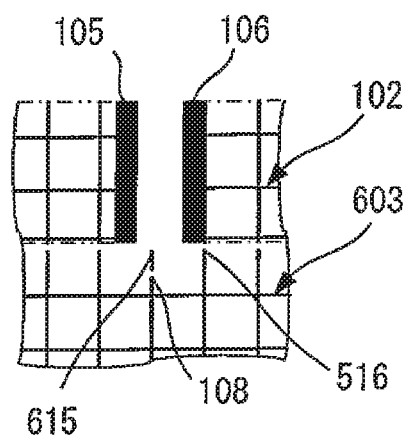
Figure 11:
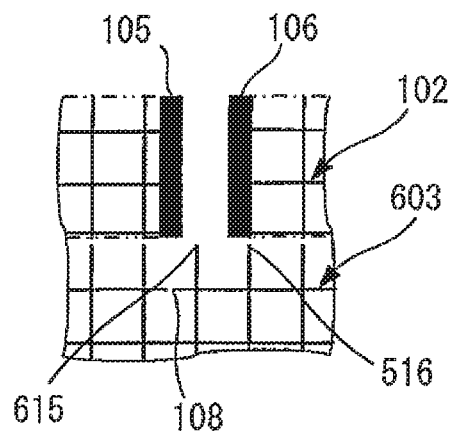

FIG. 11(a) is an enlarged view of a portion corresponding to a portion of FIG. 9 that is encircled by a dotted-line circle C2, and the portion's vicinity.

As illustrated in FIG. 11(b), a minimum loop path 614 in Modification Example 4 is a path that connects a first close end portion 615 and the second close end portion 516 over the shortest distance out of paths formed by a conductor that has a mesh structure and that forms a dummy pattern portion 603. The minimum loop path 614 is defined geometrically regardless of the presence or absence of the cut portion 108.

The cut portion 108 may be formed so as to cut the minimum loop path 614 in a manner illustrated in FIG. 11(a). The cut portion 108 may be formed so as to cut the minimum loop path 614 in a manner illustrated in FIG. 11(c). However, even when the path is cut in a place illustrated in FIG. 11(d), the minimum loop path 614 is not cut. The effect of the cut portion 108 that the path is cut to stop a flow of current that affects the operation of the antenna portion 102 is therefore not obtained when the path is cut in the place illustrated in FIG. 11(d).

When there are a plurality of minimum loop paths for one pattern dummy portion, it is preferred that cut portions be formed in all of the minimum loop paths. By forming the cut portions 108 to stop a flow of current that affects the operation of the antenna portion in the minimum loop paths, which are geometrically defined, a loop path in which the current that affects the operation of the antenna portion flows becomes larger and the effect that the loop antenna is rendered hard to visually recognize as an antenna while reducing a performance degradation as an antenna is consequently obtained. When the number of the cut portions 108 is further increased as described in the second embodiment and the first embodiment, the loop path in which the current that affects the operation of the antenna portion flows becomes even larger, and the actual performance accordingly approaches the full-capacity performance of the loop antenna.

The same effect as the one in the third embodiment is obtained in Modification Example 4 above as well.

Modification Example 5

Figure 12:
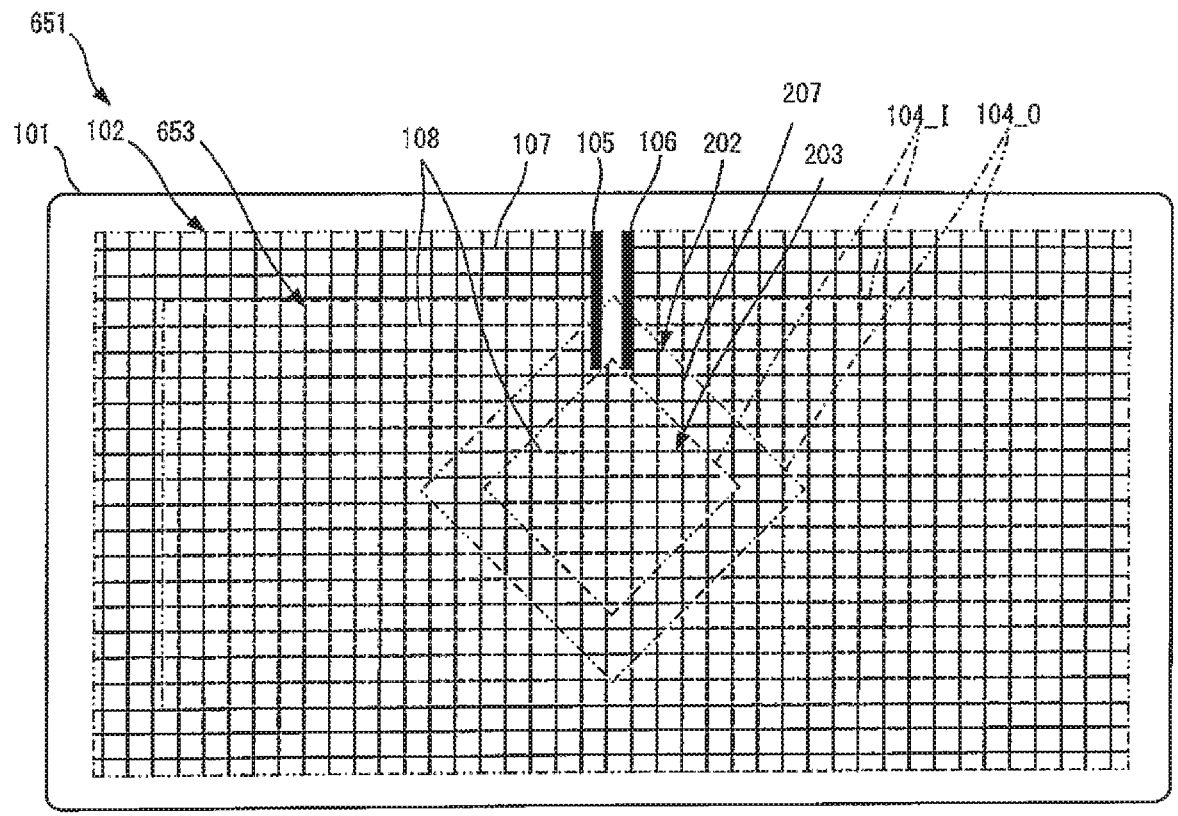
FIG. 12 is a view for illustrating a configuration of a loop antenna of Modification Example 5.

As illustrated in FIG. 12, a loop antenna 651 of Modification Example 5 includes the substrate 101, the antenna portion 102, which is the same as the one in the first embodiment, the antenna portion 202 and the dummy pattern portion 203, which are the same as those in Modification Example 1, and a dummy pattern portion 653.

As illustrated in FIG. 12, the antenna portion 202 and the dummy pattern portion 203 are formed in an area surrounded by the antenna portion 102.

The antenna portion 102 includes the antenna mesh portion 107, the antenna portion 202 includes the antenna mesh portion 207, and the antenna portions 102 and 202 share the first power feeding portion 105 and the second power feeding portion 106. In other words, the antenna mesh portions 107 and 207 are electrically connected to the shared first power feeding portion 105 and second power feeding portion 106. The antenna mesh portion 107 and the antenna mesh portion 207 differ from each other in length, which enables the single loop antenna 651 to receive or transmit radio waves of different frequencies.

The dummy pattern portion 653 is formed in a part of an area surrounded by the antenna portion 102 that excludes the antenna portion 202 and the dummy pattern portion 203. The dummy pattern portion 653 has the same mesh structure as that of the dummy pattern portion 103 of the first embodiment.

In Modification Example 5 as well, the provided loop antenna 651 is successfully rendered hard to be visually recognized as an antenna, owing to the inclusion of the dummy pattern portions 203 and 653.

In Modification Example 5, the cut portions 108 are formed in each of the dummy pattern portions 203 and 653. The performance of the antenna portions 102 and 202 as an antenna can therefore be kept from dropping. A minimum loop path in Modification Example 5 is formed in the dummy pattern portion 203, which means that the performance as an antenna can be kept from dropping by forming the cut portions 108 in the minimum loop path of the dummy pattern portion 203.

In this manner, the same effect as the one in the first embodiment is obtained in Modification Example 5 above as well.

Modification Example 6

Figure 13:
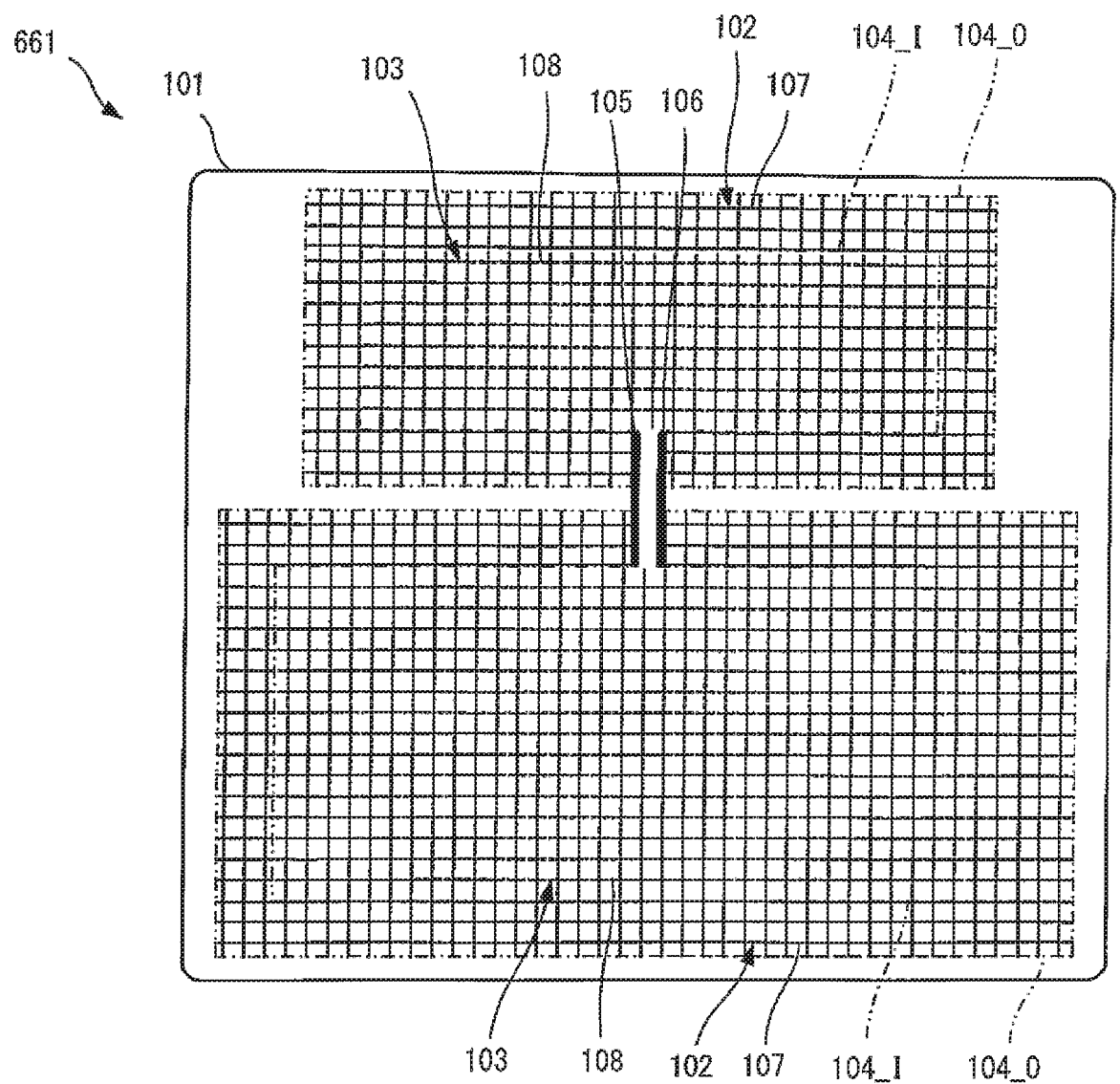
FIG. 13 is a view for illustrating a configuration of a loop antenna of Modification Example 6.

As illustrated in FIG. 13, a loop antenna 661 of Modification Example 6 includes the substrate 101 and two upper and lower sets of the antenna portion 102 and the dummy pattern portion 103.

The antenna portion 102 and the dummy pattern portion 103 in each set are substantially the same as those in the first embodiment. In Modification Example 6, however, the antenna portion 102 in the upper set and the antenna portion 102 in the lower set share the first power feeding portion 105 and the second power feeding portion 106, and differ from each other in the length of the antenna mesh portion 107. This enables the single loop antenna 661 to receive or transmit radio waves of different frequencies as in Modification Example 5.

In Modification Example 6 as well, the provided loop antenna 661 is successfully rendered hard to be visually recognized as an antenna, because the dummy pattern portion 103 is formed in an area surrounded by the antenna portion 102 in each set.

Further, in Modification Example 6, the plurality of the cut portions 108 are formed in the dummy pattern portions 103 in the respective sets, similarly to the first embodiment. The performance of the antenna portion 102 in each set as an antenna can therefore be kept from dropping. A minimum loop path in Modification Example 6 is formed in the dummy pattern portion 103 in each set, which means that the performance as an antenna can be kept from dropping by forming the cut portions 108 in the minimum loop paths of the dummy pattern portions 103.

In this manner, the same effect as the one in the first embodiment is obtained in Modification Example 6 above as well.

EXAMPLES

Example 1

The loop antenna 100 of Example 1 is obtained by setting the width A of the antenna mesh portion 107 to 10 mm, the size L of the unit shape to 3,200 μm, the thickness (corresponds to the "line width" described above) W of each conductive wire to 10 μm, the separation distance D to 10 μm, and the cut distance S to 320 μm in the loop antenna 100 according to the first embodiment.

The loop antenna 100 of Comparative Example 1 differs from the loop antenna 100 of Example 1 only in that the cut distance S is set to 10 μm.

Figure 14:
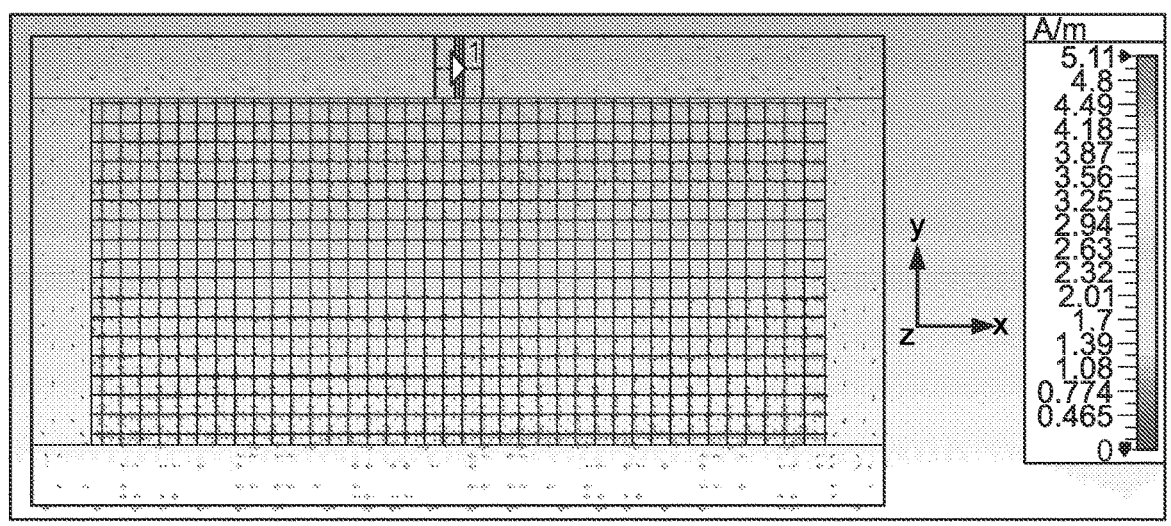
FIG. 14 includes a view and a graph for illustrating a result of electromagnetic field simulation of the loop antenna of Example 1.
Figure 14:
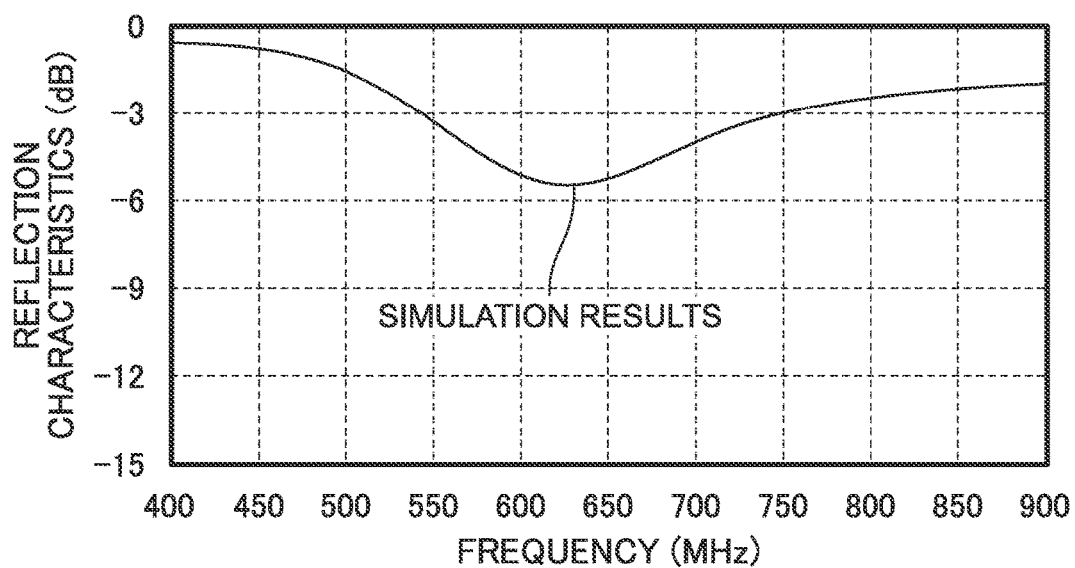
Figure 15:
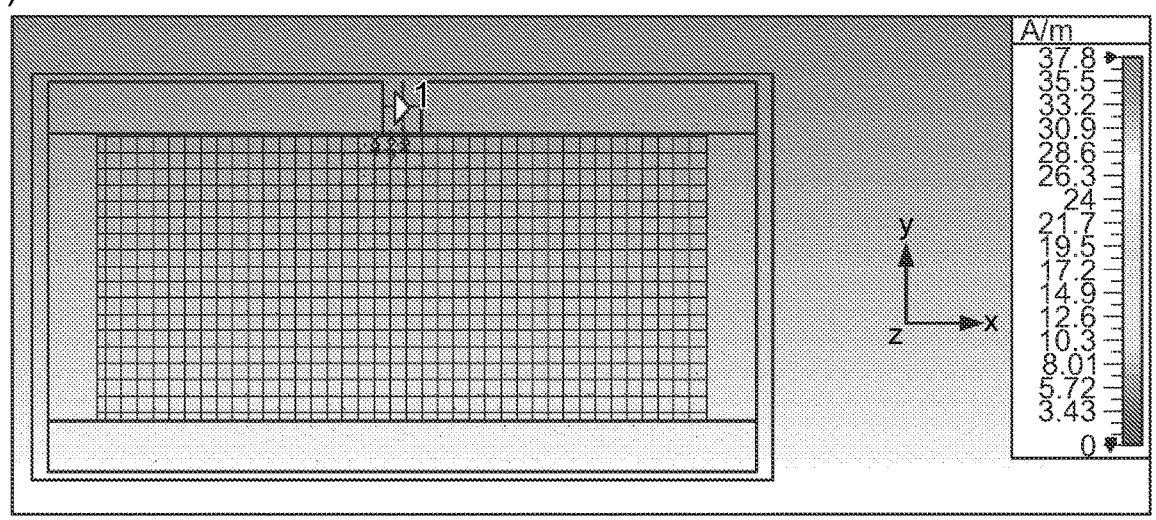
FIG. 15 includes a view and a graph for illustrating a result of electromagnetic field simulation of a loop antenna of Comparative Example 1.
Figure 15:
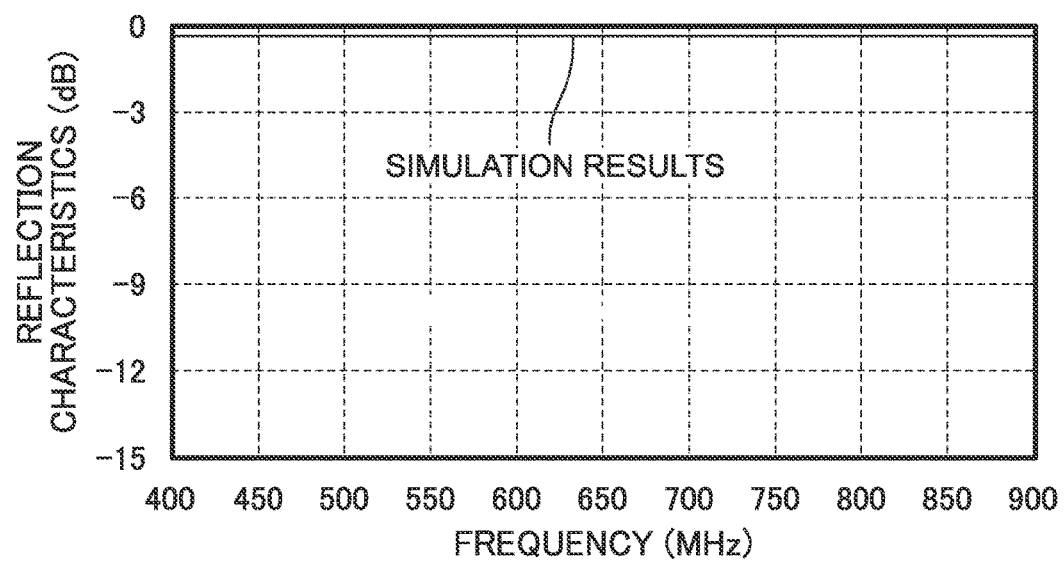

Results of performing electromagnetic field simulation for a case in which a 600-MHz radio wave is received by the loop antenna 100 of Example 1 and the loop antenna 100 of Comparative Example 1 are shown in FIG. 14 and FIG. 15, respectively. FIG. 14(a) and FIG. 15(a) are views for illustrating current distributions obtained as a result of the simulations of the loop antenna 100 of Example 1 and the loop antenna 100 of Comparative Example 1, respectively. FIG. 14(b) and FIG. 15(b) are graphs for showing reflection characteristics obtained as a result of the simulations of the loop antenna 100 of Example 1 and the loop antenna 100 of Comparative Example 1, respectively.

By comparing FIG. 14 and FIG. 15, it is found that, when the cut distance S is 320 μm, a current that affects the transmission/reception of a radio wave does not flow into the conductor of the dummy pattern portion 103, and the reflection characteristics are accordingly at a level satisfactory as an antenna. In contrast, when the cut distance S is 10 μm, the current distribution centers around the first power feeding portion 105 and the second power feeding portion 106, and the reflection characteristics are so poor that the loop antenna is not operating as an antenna. It is understood from this, when the cut distance S is 10 μm, that the conductor of the dummy pattern portion 103 is not cut in a manner that stops a flow of current that affects the operation of the antenna portion 102, that is, that there is a loop path allowing a flow of current that adversely affects the operation of the antenna portion 102.

Examples 2 to 5

The loop antenna 100 of Example 2 to the loop antenna 100 of Example 5 are each obtained by setting the width A of the antenna mesh portion 107 to 10 mm and the separation distance D to 10 µm, and by varying the combination of the size L of the unit shape and the thickness W of each conductive wire in the loop antenna 100 according to the first embodiment. The loop antenna 100 of Example 2 is 3.2 mm and 10 µm in size L and thickness W, respectively. The loop antenna 100 of Example 3 is 6.4 mm and 10 µm in size L and thickness W, respectively. The loop antenna 100 of Example 4 is 3.2 mm and 20 µm in size L and thickness W, respectively. The loop antenna 100 of Example 5 is 6.4 mm and 20 µm in size L and thickness W, respectively.

Figure 16:
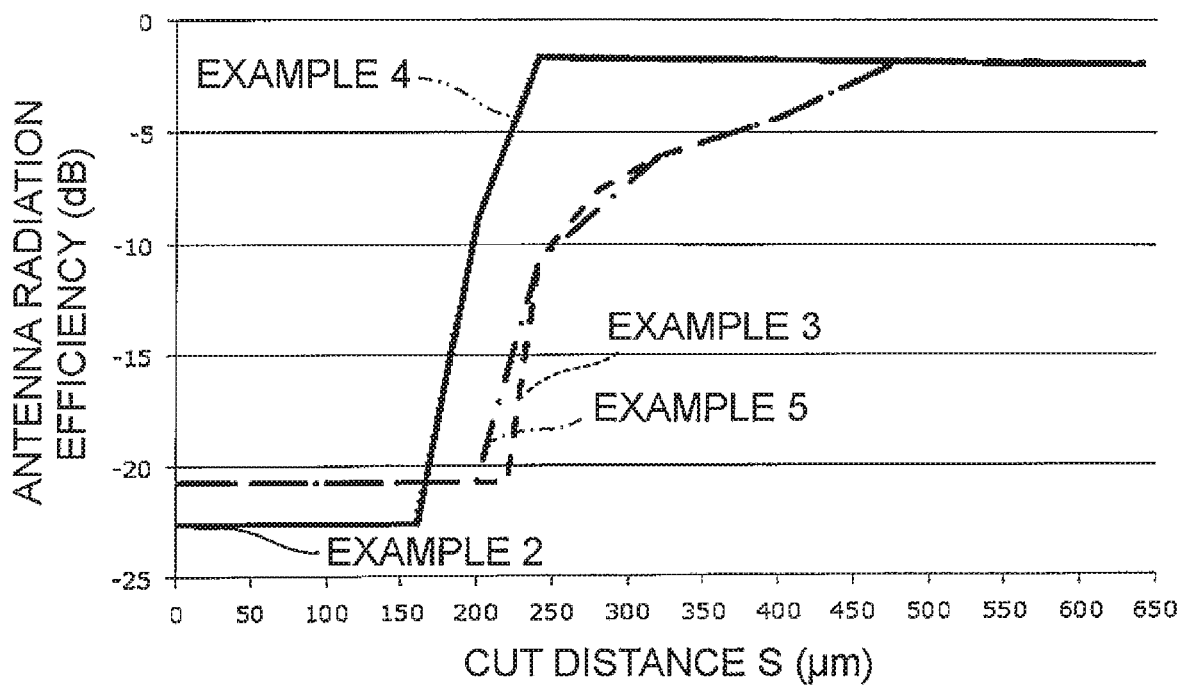
FIG. 16 is a graph for showing results of electromagnetic field simulation of loop antennas of Examples 2 to 5.

FIG. 16 is a graph for showing results of performing electromagnetic field simulation for a case in which a 600-MHz radio wave is received by the loop antenna 100 of Example 2 to the loop antenna 100 of Example 5, in the form of a relationship between the cut distance S (µm) and an antenna radiation efficiency (dB). In FIG. 16, the results of Examples 2 to 5 are indicated by the solid line, the dotted line, the one-dot chain line, and the two-dot chain line, respectively, and the graphs representing the simulation results of Example 2 and Example 4 overlap in most parts.

It is found that antenna radiation characteristics are brought to a level at which the loop antenna can function as an antenna by setting the cut distance S greater than approximately 240 µm when the size L of the unit shape is 3.2 mm, and by setting the cut distance S greater than approximately 480 µm when the size L of the unit shape is 6.4 mm.

Examples 6 and 7

The loop antenna 200 of Example 6 and the loop antenna 200 of Example 7 are each obtained by setting the width A of the antenna mesh portion 107 to 10 mm and the separation distance D to 10 µm, and by varying the combination of the size L of the unit shape and the thickness W of each conductive wire in the loop antenna 200 of Modification Example 1. The loop antenna 200 of Example 6 is 3.2 mm and 10 µm in size L and thickness W, respectively. The loop antenna 100 of Example 7 is 6.4 mm and 10 µm in size L and thickness W, respectively.

Figure 17:
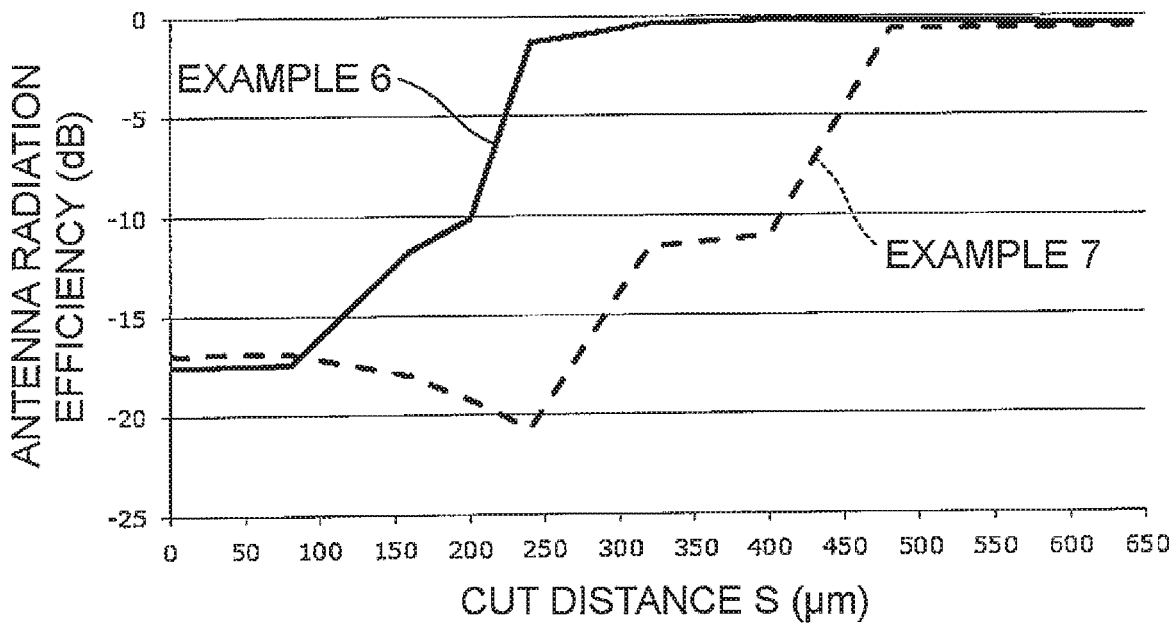
FIG. 17 is a graph for showing results of electromagnetic field simulation of loop antennas of Examples 6 and 7.

FIG. 17 is a graph for showing results of performing electromagnetic field simulation for a case in which a 2-GHz radio wave is received by the loop antenna 100 of Example 6 and the loop antenna 100 of Example 7, in the form of a relationship between the cut distance S (µm) and an antenna radiation efficiency (dB). In FIG. 17, the results of Examples 6 and 7 are indicated by the solid line and the dotted line, respectively.

It is found that antenna radiation characteristics are brought to a level at which the loop antenna can function as an antenna by setting the cut distance S greater than approximately 240 µm when the size L of the unit shape is 3.2 mm, and by setting the cut distance S greater than approximately 480 µm when the size L of the unit shape is 6.4 mm.

Examples 8 and 9

Example 8 is an example of the loop antenna 300 according to the second embodiment. Example 9 is an example of the loop antenna 400 of Modification Example 3. In the loop antenna 300 of Example 8 and the loop antenna 400 of Example 9, the width A of the antenna mesh portion 107 is set to 10 mm, the separation distance D is set to 10 µm, the size L of the unit shape is set to 6,400 µm, the thickness W of each conductive wire is set to 10 µm, and the cut distance S is set to 480 µm.

Comparative Example 2 is an example of a loop antenna in which no cut portion 108 is formed in the dummy pattern portion 303 or 403. In the loop antenna of Comparative Example 2, the width A, the separation distance D, the size L of the unit shape, the thickness W of each conductive wire, and the cut distance S are the same as those in the loop antenna 300 of Example 8 and the loop antenna 400 of Example 9.

Figure 18:
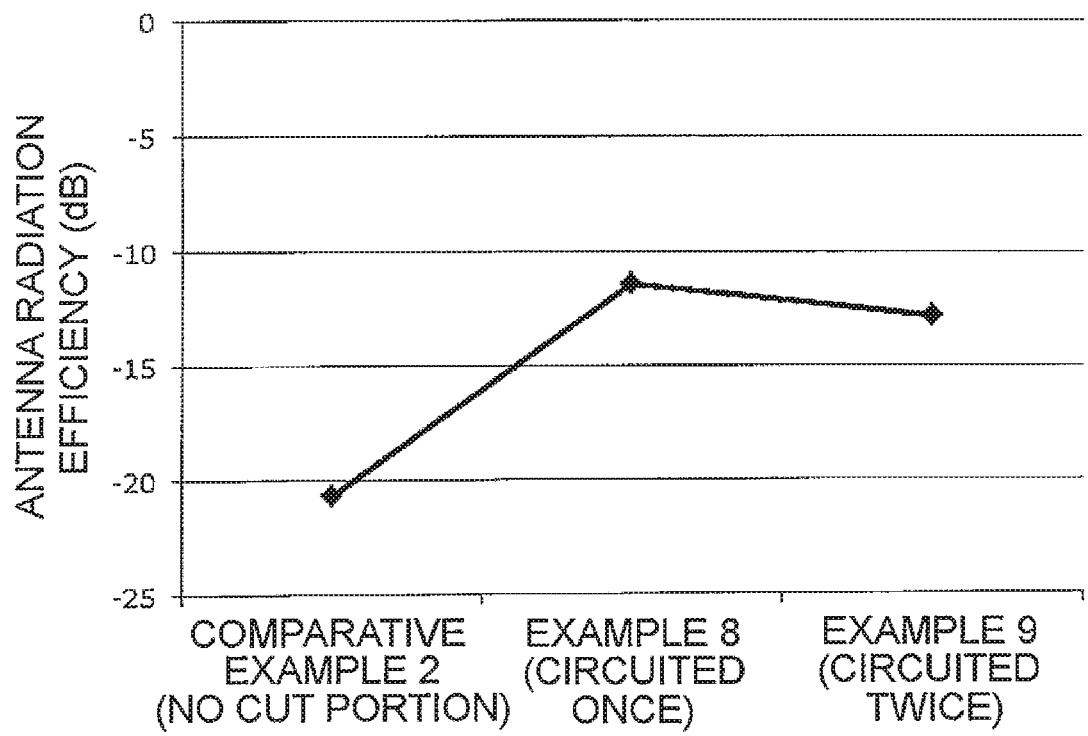
FIG. 18 is a graph for showing results of electromagnetic field simulation of loop antennas of Comparative Example 2 and Examples 8 and 9.

FIG. 18 is a graph for showing results of performing electromagnetic field simulation for a case in which a 600-MHz radio wave is received by the loop antenna of Comparative Example 2, the loop antenna 300 of Example 8, and the loop antenna 400 of Example 9, in the form of the antenna radiation efficiencies (dB) of the loop antennas.

It is understood from the result of Example 8 that antenna radiation characteristics are brought to a level at which the loop antenna can function as an antenna by forming the cut portions 108 so as to circuit along the loop shape once as in the second embodiment.

Example 10

The loop antenna 500 of Example 10 is obtained by setting the width A of the antenna mesh portion 107 to 10 mm, the separation distance D to 10 µm, the size L of the unit shape to 6,400 µm, and the thickness W of each conductive wire to 10 µm in the loop antenna 500 (see FIG. 9) according to the third embodiment.

Figure 19:
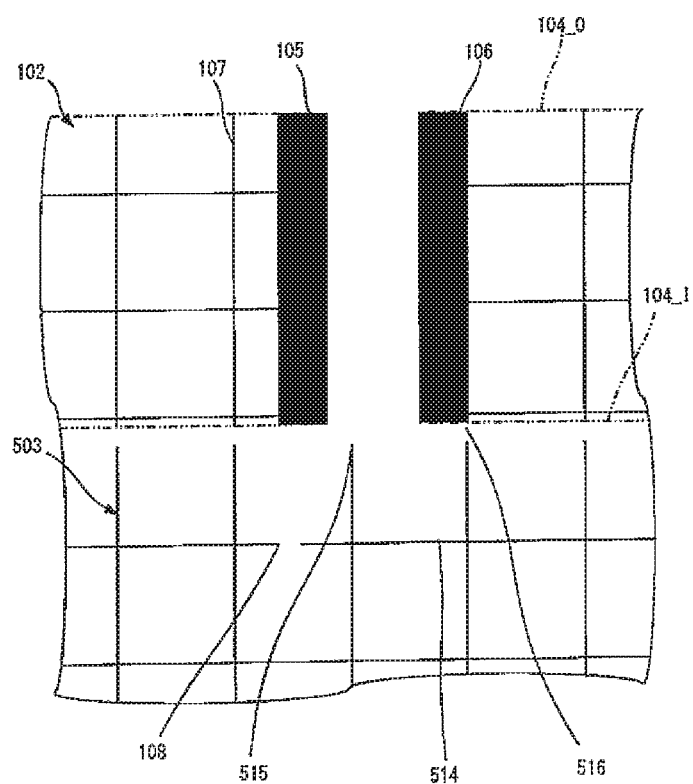
FIG. 19 is an enlarged view of a portion corresponding to the portion of FIG. 9 that is encircled by the dotted-line circle C2 and the portion's vicinity, out of a loop antenna of Comparative Example 3.

As illustrated in FIG. 19, a loop antenna of Comparative Example 3 is the same as the loop antenna 500 of Example 10, except that no cut portion 108 is formed in the minimum loop path 514. FIG. 19 is an enlarged view of a portion corresponding to FIG. 10 in the loop antenna of Comparative Example 3.

Figure 20:
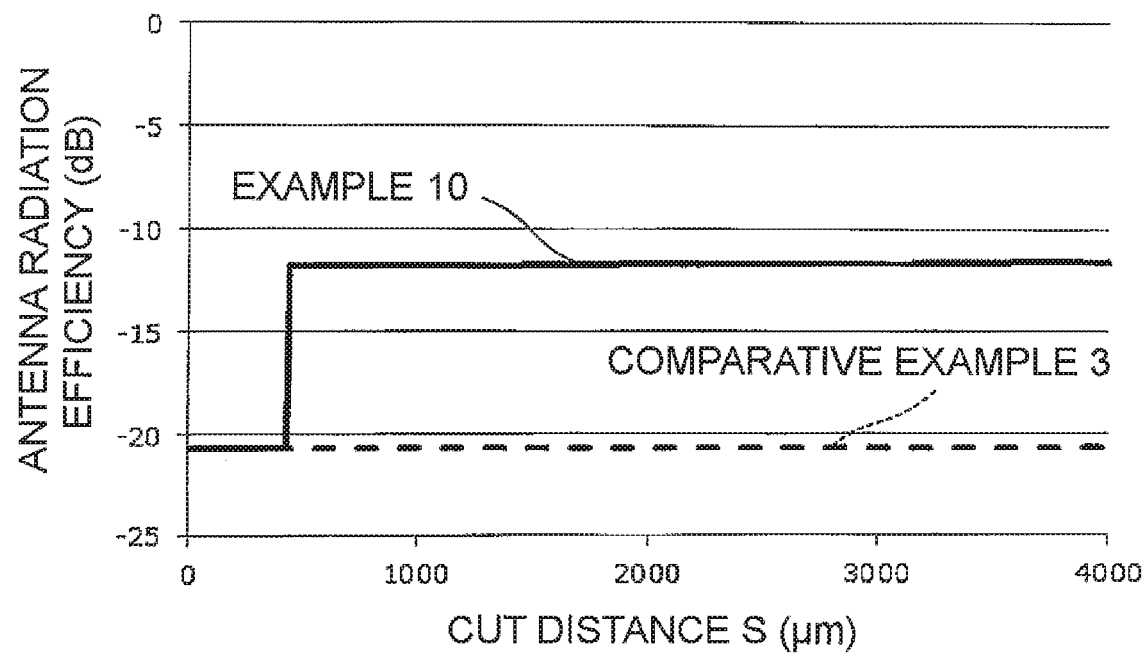
FIG. 20 is a graph for showing results of electromagnetic field simulation of a loop antenna of Example 10 and the loop antenna of Comparative Example 3.

FIG. 20 is a graph for showing results of performing electromagnetic field simulation for a case in which a 600-MHz radio wave is received by the loop antenna 500 of Example 10 and the loop antenna 500 of Comparative Example 3, in the form of a relationship between the cut distance S (µm) and an antenna radiation efficiency (dB). In FIG. 20, the results of Example 10 and Comparative Example 3 are indicated by the solid line and the dotted line, respectively.

Examples 11 to 13

Figure 21:
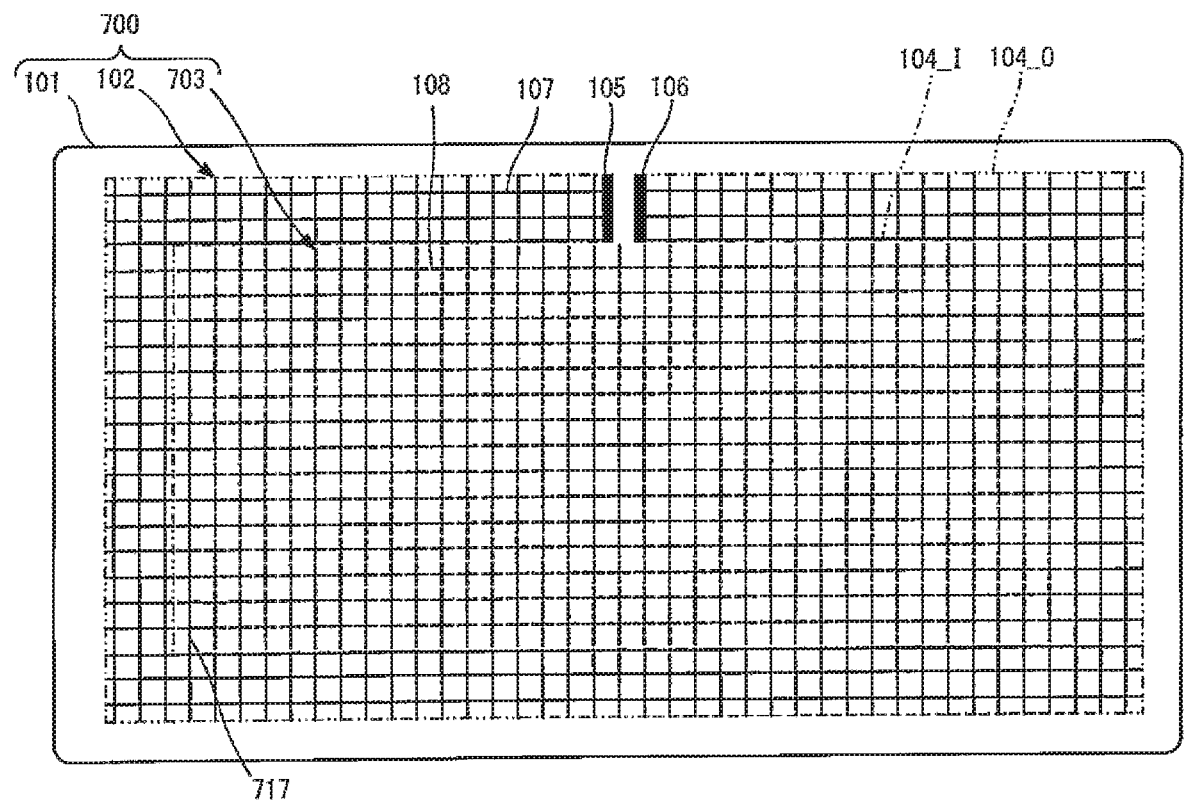
FIG. 21 is a view for illustrating a configuration of a loop antenna of Example 11.

As illustrated in FIG. 21, a loop antenna 700 of Example 11 is obtained by omitting the cut portions 108 in a conductive wire 717, which is one line extending in a longitudinal direction at the left end out of conductive wires of a dummy pattern portion 703, and connecting the conductive wire 717 to the antenna portion 102 in the loop antenna 100 according to the first embodiment.

Figure 22:
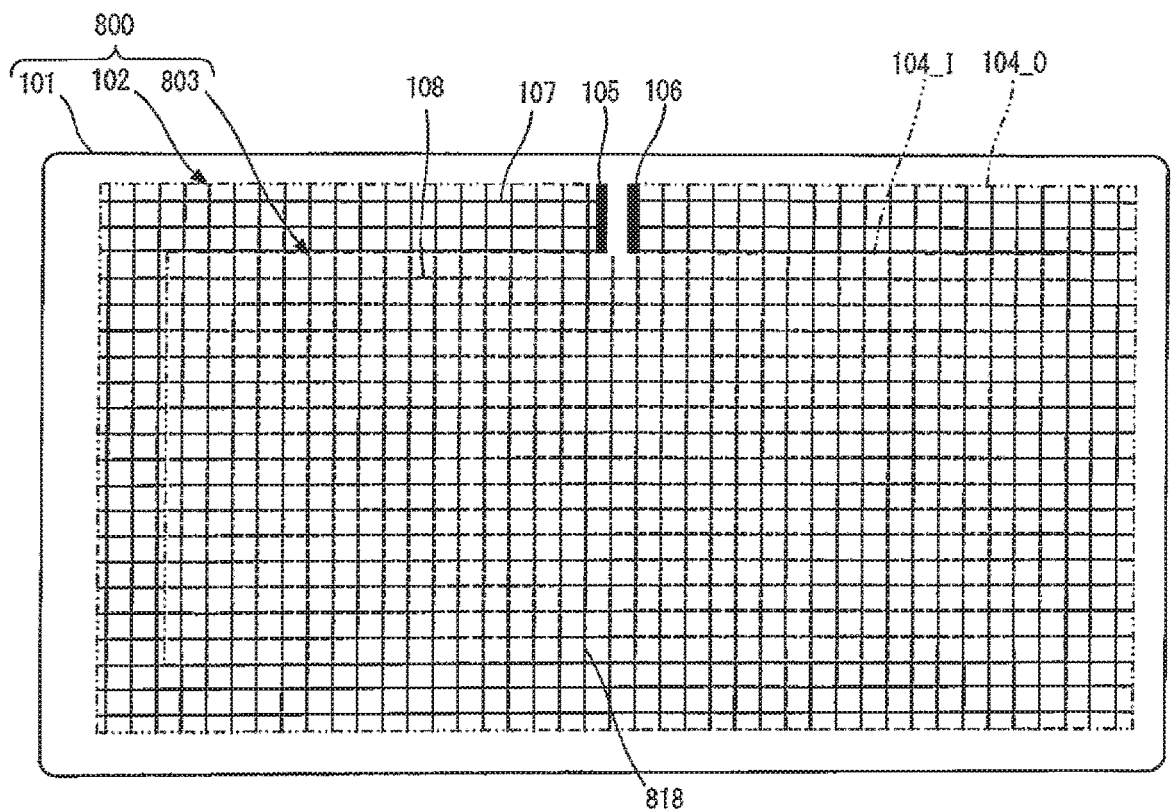
FIG. 22 is a view for illustrating a configuration of a loop antenna of Example 12.

As illustrated in FIG. 22, a loop antenna 800 of Example 12 is obtained by omitting the cut portions 108 in a conductive wire 818, which is one line extending in a longitudinal direction substantially in the middle out of conductive wires of a dummy pattern portion 803, and connecting the conductive wire 818 to the antenna portion 102 in the loop antenna 100 according to the first embodiment.

Figure 23:
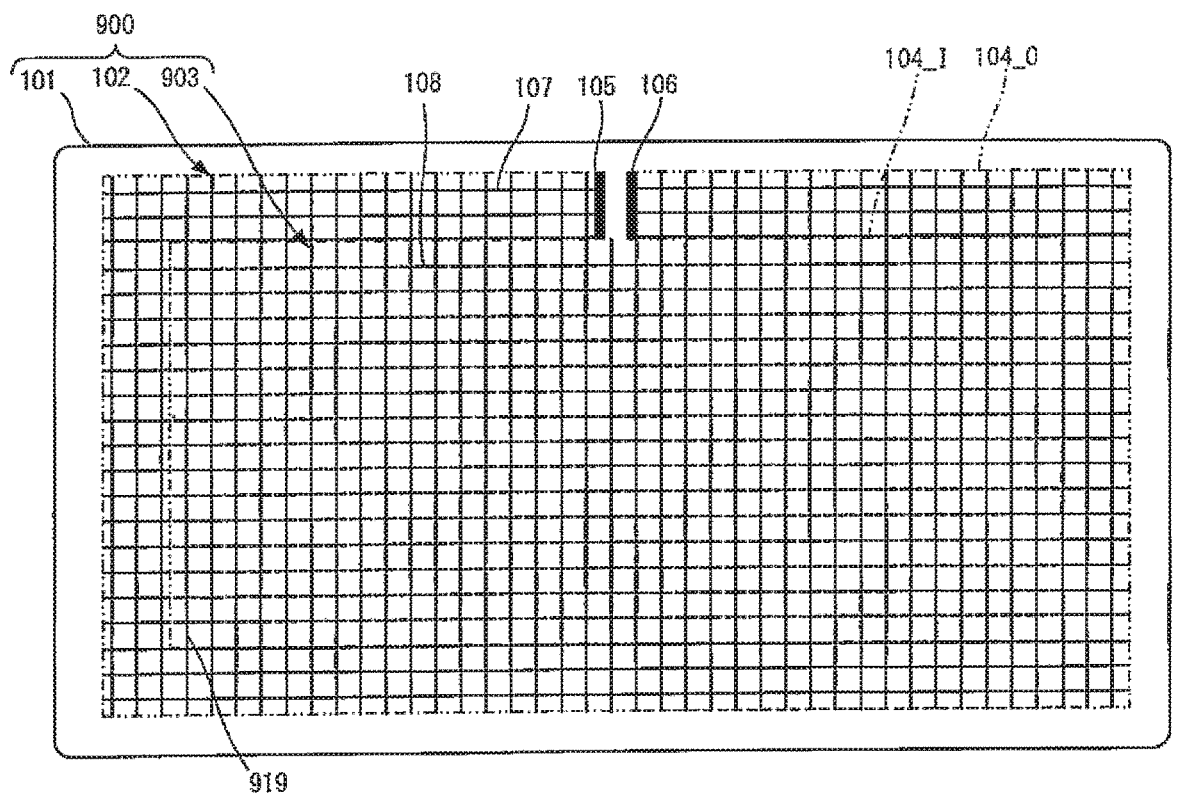
FIG. 23 is a view for illustrating a configuration of a loop antenna of Example 13.

As illustrated in FIG. 23, a loop antenna 900 of Example 13 is obtained by omitting the cut portions 108 in every conductive wire 919, which extends in a longitudinal direction out of conductive wires of a dummy pattern portion 903, and connecting the conductive wires 919 to the antenna portion 102 in the loop antenna 100 according to the first embodiment.

In each of the loop antenna 700 of Example 11, the loop antenna 800 of Example 12, and the loop antenna 900 of Example 13, the width A of the antenna mesh portion 107 is set to 10 mm, the separation distance D is set to 10 μm, the size L of the unit shape is set to 6,400 μm, and the thickness W of each conductive wire is set to 10 μm as in the loop antenna 100 of Example 3. The cut distance S is set to 480 μm in each of the loop antenna 700 of Example 11, the loop antenna 800 of Example 12, and the loop antenna 900 of Example 13.

Figure 24:
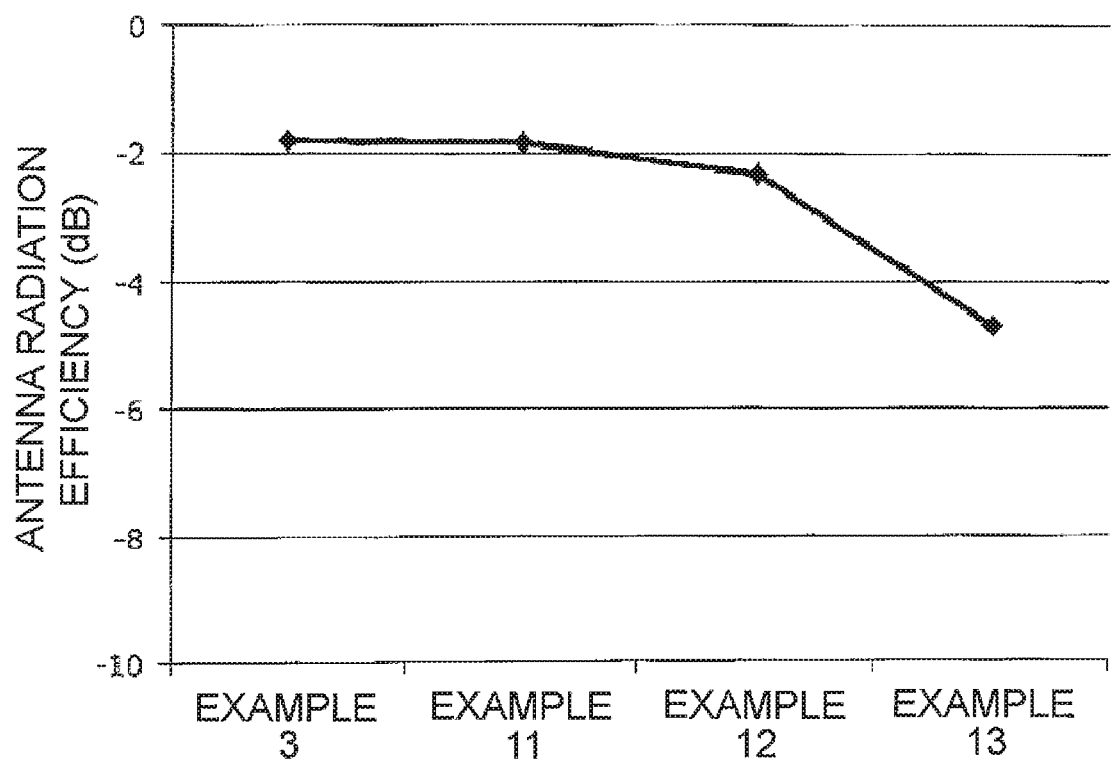
FIG. 24 is a graph for showing results of electromagnetic field simulation of the loop antennas of Comparative Example 3 and Examples 11 to 13.
Figure 25:
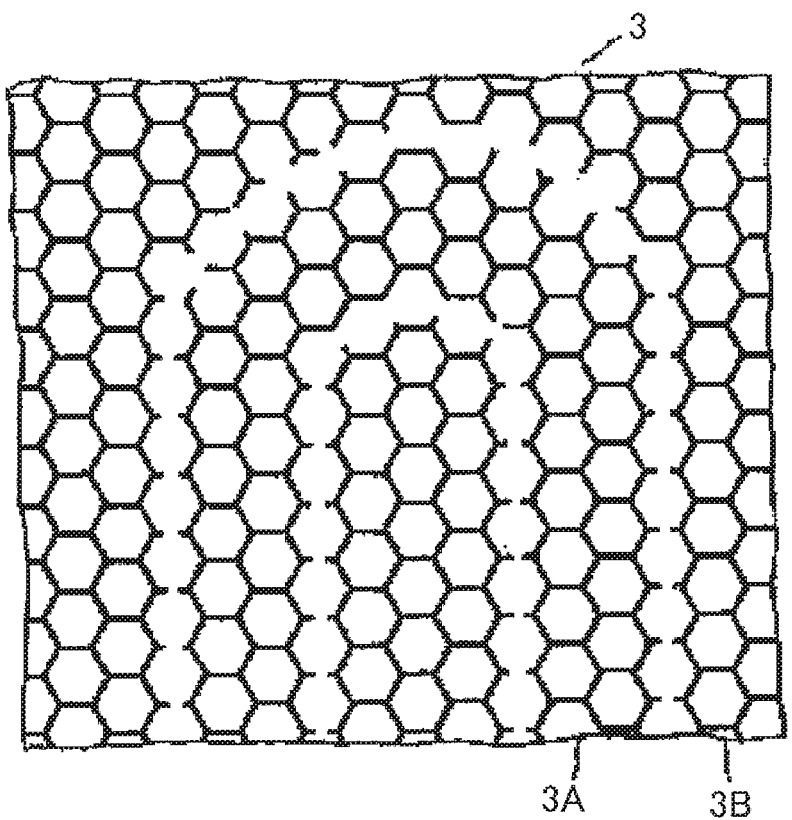
FIG. 25 is a view for illustrating a configuration of a film antenna of the related art.
Figure 26:
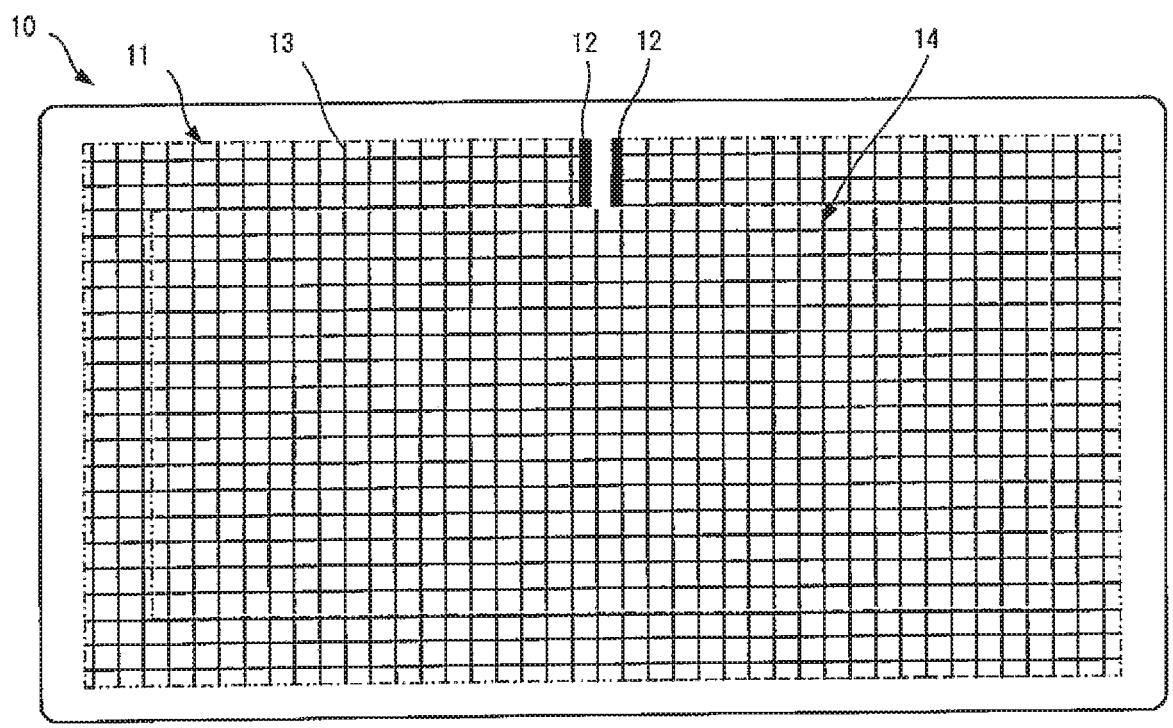
FIG. 26 is a view for illustrating a configuration of a virtual loop antenna that is expected from application of the invention described in Patent Document 1 to a loop antenna of that adopts a mesh structure for a loop-shaped conductor.
Figure 27:
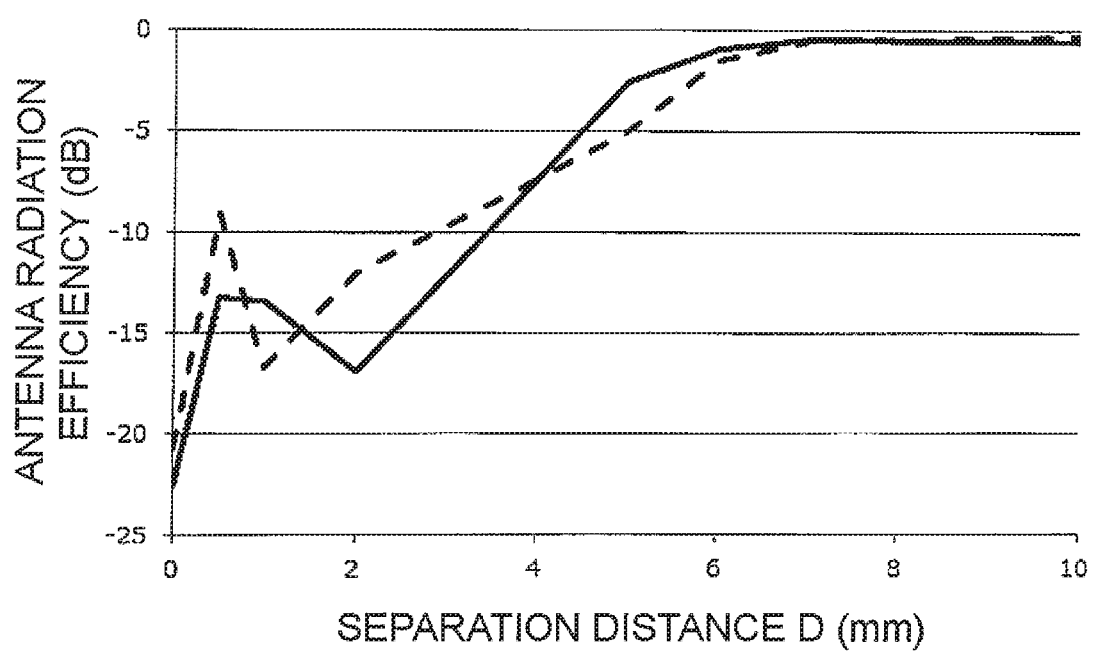
FIG. 27 is a graph for showing results of electromagnetic field simulation of the virtual loop antenna.

FIG. 24 is a graph for showing results of performing electromagnetic field simulation for a case in which a 600-MHz radio wave is received by the loop antenna 100 of Example 3, the loop antenna 700 of Example 11, the loop antenna 800 of Example 12, and the loop antenna 900 of Example 13 in the form of the antenna radiation efficiencies (dB) of the loop antennas. It is found that antenna radiation characteristics are brought to a level at which the loop antenna can function as an antenna also when one of the conductive wires extending in a longitudinal direction is connected to the antenna portion 102 as in the dummy pattern portions 703 and 803.

In the above, the embodiments and Modification Examples of this invention are described. However, this invention is not limited to those embodiments and Modification Examples. For example, this invention may include a mode in which the embodiments and Modification Examples described above are partially or entirely combined in a suitable manner or a mode suitably changed from the mode of combination.

REFERENCE SIGNS LIST 100, 200, 300, 400, 500, 651, 661, 700, 800, 900 loop antenna
101 substrate
102, 202 antenna portion
103, 203, 303, 403, 503, 603, 653, 703, 803, 903 dummy pattern portion
104_I, 104_O two-dot chain line
105 first power feeding portion
106 second power feeding portion
107, 207 antenna mesh portion
108 cut portion
309 first dummy loop portion
310 first intersecting line
311 second dummy loop portion
412 second intersecting line
413 third dummy loop portion
514, 614 minimum loop path
515, 615 first close end portion
516 second close end portion
717, 818 conductive wire in one line
919 every conductive wire extending in longitudinal directions

The invention claimed is:

1. A loop antenna, comprising:
an insulating substrate including one surface that spreads in surface shape;
an antenna portion, which is a conductor formed on the one surface of the substrate to receive or transmit a radio wave, and which includes a first power feeding portion, a second power feeding portion, and an antenna mesh portion having a mesh structure, the antenna mesh portion being shaped into a loop to connect the two power feeding portions to each other; and
a dummy pattern portion, which is a conductor having a mesh structure and formed in an area of the one surface of the substrate that is surrounded by the antenna portion, and which is separated from the antenna portion,
wherein the dummy pattern portion includes:
a first close end portion closest to the first power feeding portion;
a second close end portion closest to the second power feeding portion; and
a cut portion formed to cut a path that is included in the mesh structure, so that a flow of current that affects operation of the antenna portion is prevented from flowing, and
wherein the cut portion is formed in a minimum loop path geometrically defined as a path that connects the first close end portion and the second close end portion over the shortest distance out of paths formed by the conductor having the mesh structure.

2. The loop antenna according to claim 1,
wherein the cut portion is one of a plurality of cut portions formed,
wherein the dummy pattern portion includes:
a first dummy loop portion, out of loops formed by the conductor of the dummy pattern portion, which is a conductor that forms the largest loop along the antenna portion;
a second dummy loop portion, out of the loops formed by the conductor of the dummy pattern portion, which is a conductor that forms the largest loop along the first dummy loop portion in an area surrounded by the first dummy loop portion; and
a plurality of intersecting lines, which are located between the antenna portion and the second dummy loop portion, and intersect the first dummy loop portion, and
wherein at least one of the plurality of cut portions are formed in each section of the first dummy loop portion that is located between two adjacent intersecting lines out of the plurality of intersecting lines, and in each of the plurality of intersecting lines.

3. The loop antenna according to claim 1,
wherein the cut portion comprises a plurality of cut portions formed,
wherein the mesh structure of the dummy pattern portion is a structure in which a plurality of unit shapes are connected in a two-dimensionally continuous manner, and
wherein at least one of the plurality of cut portions is formed in every one of the plurality of unit shapes.

4. The loop antenna according to claim 1, wherein the antenna portion and the dummy pattern portion have the same mesh structure.

5. The loop antenna according to claim 4, wherein the mesh structure has squares or circles as the plurality of unit shapes.

6. The loop antenna according to claim 1, wherein the first power feeding portion and the second power feeding portion are each a conductor having a mesh structure that has higher density than that of the mesh structure of the antenna mesh portion, or a conductor spreading in surface shape without a break.

7. The loop antenna according to claim 1, wherein the substrate comprises a resin film.

\* \* \* \* \*

UNITED STATES PATENT AND TRADEMARK OFFICE
CERTIFICATE OF CORRECTION

Page 1 of 1

PATENT NO. : 10,998,609 B2
APPLICATION NO. : 16/613633
DATED : May 4, 2021
INVENTOR(S) : Kenta Tsuchiya et al.

It is certified that error appears in the above-identified patent and that said Letters Patent is hereby corrected as shown below:

On the Title Page

Column 2, Item (56) References Cited, OTHER PUBLICATIONS, Line 1, please change "Ohinese Office Action in CN 201880033224.9, dated Jul. 28, 2020" to correctly read:
-- Chinese Office Action in CN 201880033224.9, dated Jul. 28, 2020 --

Item (57) ABSTRACT, Lines 6-7, please change "a dummy pattern part portion" to correctly read:
-- a dummy pattern portion --

In the Specification

In Column 5, Lines 14-15, please change "a loop antenna of that adopts" to correctly read:
-- a loop antenna that adopts --

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*